(12) United States Patent
Park et al.

(10) Patent No.: US 9,640,572 B2
(45) Date of Patent: May 2, 2017

(54) UNIT PIXEL FOR IMAGE SENSOR

(71) Applicant: BEYONDEYES, Suwon-si, Gyeonggi-do (KR)

(72) Inventors: Kwangsue Park, Seoul (KR); Byung Il Min, Suwon-si (KR); Dong Wook Nam, Suwon-si (KR)

(73) Assignee: BEYONDEYES, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/103,797

(22) PCT Filed: Dec. 12, 2014

(86) PCT No.: PCT/KR2014/012279
§ 371 (c)(1),
(2) Date: Jun. 10, 2016

(87) PCT Pub. No.: WO2015/088280
PCT Pub. Date: Jun. 18, 2015

(65) Prior Publication Data
US 2016/0315111 A1    Oct. 27, 2016

(30) Foreign Application Priority Data

Dec. 13, 2013  (KR) .................. 10-2013-0155762
Oct. 14, 2014  (KR) .................. 10-2014-0138572

(51) Int. Cl.
  *H01L 27/146* (2006.01)
  *H01L 29/788* (2006.01)
  *H01L 29/78* (2006.01)

(52) U.S. Cl.
  CPC .. *H01L 27/14612* (2013.01); *H01L 27/14616* (2013.01); *H01L 27/14689* (2013.01); *H01L 29/788* (2013.01); *H01L 29/7833* (2013.01)

(58) Field of Classification Search
  CPC ......... H01L 27/14612; H01L 27/14616; H01L 27/14689; H01L 29/7833; H01L 29/788
  See application file for complete search history.

(56) References Cited

U.S. PATENT DOCUMENTS

2003/0107107 A1   6/2003   Chang et al.
2007/0202674 A1   8/2007   Cohen et al.
(Continued)

FOREIGN PATENT DOCUMENTS

KR   10-2009-0043737   5/2009
KR   10-2013-0025791   3/2013
(Continued)

OTHER PUBLICATIONS

International Search Report, dated Mar. 18, 2015, received in corresponding International Patent Application No. PCT/KR2014/012279.

(Continued)

*Primary Examiner* — Daniel Shook
(74) *Attorney, Agent, or Firm* — Knobbe Martens Olson & Bear LLP

(57) ABSTRACT

A unit pixel formed on a substrate and configured to convert incident light to an electrical signal is provided. The unit pixel includes: a source having a source voltage supplied thereto and having a silicide layer for metal contact formed thereabove; a drain spaced apart from the source and having a silicide layer for metal contact formed thereabove; a channel formed between the source and the drain and having a current flowed therethrough; an insulating layer formed above the channel; and a floating gate having a nonsal structure in which no silicide layer is formed thereabove in order to facilitate an absorption of light, formed above the insulating layer so as to be placed between the source and the drain, and configured to control an amount of current flowing through the channel by an electric field generated by (Continued)

electron-hole pairs generated by the incident light. A body of the unit pixel is floated, and the electric field is configured to act on the channel by electrons aggregated toward the source and holes aggregated toward the drain by the source voltage supplied to the source.

21 Claims, 18 Drawing Sheets

(56) References Cited

U.S. PATENT DOCUMENTS

| | | |
|---|---|---|
| 2010/0149395 A1 | 6/2010 | Rhodes |
| 2010/0155806 A1 | 6/2010 | Fourches |
| 2010/0314667 A1 | 12/2010 | Nozaki et al. |
| 2013/0056709 A1 | 3/2013 | Kim |
| 2013/0056806 A1* | 3/2013 | Kim .................. H01L 27/14645 257/290 |
| 2016/0013352 A1* | 1/2016 | Kim .................... H01L 27/1461 257/290 |

FOREIGN PATENT DOCUMENTS

| | | |
|---|---|---|
| KR | 10-2013-0025792 | 3/2013 |
| WO | WO 2013/032217 A1 | 3/2013 |

OTHER PUBLICATIONS

Office Action dated Jan. 8, 2016 for Korean Patent Application No. KR 10-2014-0138572.
Search Report and Written Opinion dated Mar. 18, 2015 for PCT application PCT/KR2014/012279.

* cited by examiner

UNIT PIXEL FOR IMAGE SENSOR

TECHNICAL FIELD

The present invention relates to an image sensor, more specifically to a unit pixel of an image sensor having high sensitivity.

BACKGROUND ART

An image senor is a sensor converting light into an electric signal. Representative image sensors include APS (active pixel sensor) and PPS (passive pixel sensor) using CMOS. The photo diode used in the image sensor accumulates incident light and converts the accumulated light into an electric signal. The general photo diode outputs a low current from a small amount of light and thus has to lengthen the exposure time in order to accumulate sufficient electric charge for processing the signal. Accordingly, it is difficult to apply an image sensor using the general photo diode to a high-speed camera. Moreover, since a small amount of light is incident in a dark surrounding, images generated using this kind of image sensor have an unreliable quality. Although there have been studies about a unit pixel of an image sensor having high sensitivity, the afterimage effect or the memory effect still remains to be resolved.

SUMMARY

According to an aspect of the present invention, there is provided a unit pixel formed on a substrate and configured to convert incident light to an electrical signal. The unit pixel includes: a source having a source voltage supplied thereto and having a silicide layer for metal contact formed thereabove; a drain spaced apart from the source and having a silicide layer for metal contact formed thereabove; a channel formed between the source and the drain and having a current flowed therethrough; an insulating layer formed above the channel; and a floating gate having a nonsal structure in which no silicide layer is formed thereabove in order to facilitate an absorption of light, formed above the insulating layer so as to be placed between the source and the drain, and configured to control an amount of current flowing through the channel by an electric field generated by electron-hole pairs generated by the incident light, wherein a body of the unit pixel is floated, and wherein the electric field is configured to act on the channel by electrons aggregated toward the source and holes aggregated toward the drain by the source voltage supplied to the source.

According to an embodiment, the insulating layer may be formed to be extended at a lower portion of the floating gate.

According to an embodiment, a thickness of the insulating layer may be about 7 to 10 nm.

According to an embodiment, the insulating layer may be made of a high-K insulating material.

According to an embodiment, the floating gate may be doped to be intrinsic.

According to an embodiment, a thickness of the floating gate may be between about 100 nm and 1 um.

According to an embodiment, a lower edge of the floating gate may be formed as a plane to allow the electrons to be dispersed.

According to an embodiment, the insulating layer may be placed between the source and the drain, and lateral surfaces thereof may by each formed at an inclined trench.

According to an embodiment, the source may include: an LDD (lightly doped drain) region formed at a lower portion of one side of the floating gate; a P+ region formed at one side of the LDD region; and a silicide layer formed on at least a portion above the P+ region for metal contact.

According to an embodiment, the LDD region may be formed at a predetermined depth in the lower portion of one side of the floating gate and spaced apart from the insulating layer.

According to an embodiment, the LDD region may be formed with a low doping concentration in order to lower an electric field with the floating gate.

According to an embodiment, the substrate may be an epitaxial wafer.

According to an embodiment, the substrate may be an SOI wafer.

According to another aspect of the present invention, there is provided a unit pixel formed on a substrate and configured to convert incident light to an electrical signal. The unit pixel includes: a light-receiving part configured to output a pixel current by the incident light; and a select transistor configured to control an output of the pixel current, wherein the light-receiving part includes: a source having a silicide layer for metal contact formed thereabove; a drain spaced apart from the source and having a silicide layer for metal contact formed thereabove; a channel formed between the source and the drain and having a current flowed therethrough; an insulating layer formed above the channel; and a floating gate having a nonsal structure in which no silicide layer is formed thereabove in order to facilitate an absorption of light, formed above the insulating layer so as to be placed between the source and the drain, and configured to control an amount of current flowing through the channel by an electric field generated by electron-hole pairs generated by the incident light, wherein a body of the unit pixel is floated, and wherein the electric field is generated by electrons aggregated toward the source and holes aggregated toward the drain by the source voltage supplied to the source.

According to an embodiment, the light-receiving part may be formed in an N-well formed in the substrate.

According to an embodiment, the light-receiving part may further include a reset terminal formed in the N-well and having a reset signal inputted thereto.

According to an embodiment, the unit pixel may further include: a drain formed in the N-well; a source formed in the substrate and having source voltage inputted thereto; and a reset gate placed between the drain and the source and having a reset signal inputted thereto.

According to an embodiment, a body of the select transistor may be connected to a ground.

According to an embodiment, the light-receiving part and the select transistor may share a body.

According to an embodiment, the unit pixel may further include a charge pump for supplying a high voltage to a gate of the select transistor.

According to an embodiment, the unit pixel may further include a polarization inducing structure spaced apart from an upper portion of the floating gate.

BRIEF DESCRIPTION OF DRAWINGS

Hereinafter, the present invention will be described with reference to embodiments illustrated in the accompanying drawings. To help understanding of the present invention, throughout the accompanying drawings, identical reference numerals are assigned to identical elements. The elements illustrated throughout the accompanying drawings are mere examples of embodiments illustrated for the purpose of describing the present invention and are not to be used to restrict the scope of the present invention.

MODE FOR INVENTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention.

Figure 1:
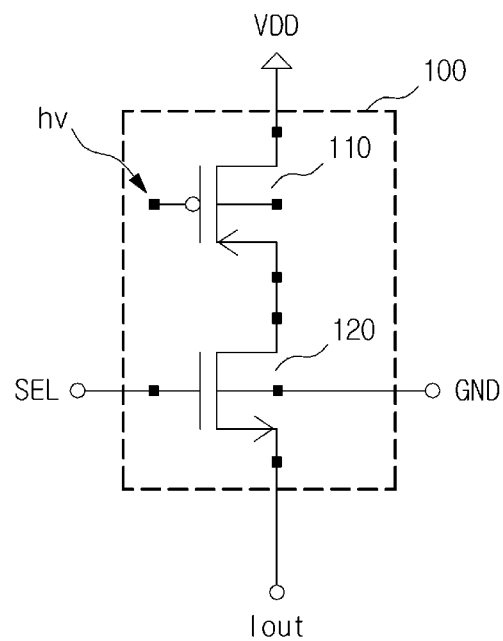
FIG. 1 illustrates an example of a circuit of a unit pixel of an image sensor.

FIG. 1 illustrates an example of a circuit of a unit pixel of an image sensor.

A unit pixel 100 performs photoelectric conversion of light to output a pixel current. For this, the unit pixel 100 is constituted with PMOS 110, which functions as a light-receiving part for photoelectric conversion of incident light, and NMOS 120, which is connected to PMOS 110 to function as a switch. Here, PMOS 110 controls the amount of the pixel current flowing through a channel formed between a source and a drain by an electric field that is generated by a floating gate that is polarized by the incident light, and NMOS 120 functions as a select transistor to perform the functions of selecting the unit pixel 100 to output the pixel current and determining an exposure time. NMOS 120 executes a switching operation by an SEL control signal applied to a control gate, and the SEL control signal may be a voltage signal greater than source voltage VDD. Here, NMOS 120 may be a native transistor having a low Vth or a medium Vt transistor.

The source of PMOS 110 is coupled to the source voltage VDD, and the drain thereof is coupled to the drain of NMOS 120. The body of PMOS 110 is formed as a floating body, and the body of NMOS 120 is coupled to ground voltage GND. Meanwhile, in a pixel area, the body of NMOS 120 or P-well may be formed as a floating body. The source of NMOS 120 outputs the pixel current, and the outputted pixel current may be applied to an IVC (I-V Converter). PMOS 110 and NMOS 120 may be realized through a general MOSFET process.

The unit pixel 100 operates as follows. Once the source voltage VDD is applied to the source of PMOS 110 formed on a same substrate as NMOS 120, a PN junction is formed in every area where N-well and p-type substrate face each other, and a thick depletion region, which is electrically neutral, is formed due to reverse bias. Moreover, the source voltage has a P channel induced due to an electric field between the source and the drain of PMOS 110. Afterwards, when light is incident at PMOS 110, which is the light-receiving part, photons are incident at the floating gate and a lower junction interface of N-well, in which the depletion region is formed, to create an electron hole pair (EHP). At the floating gate of PMOS 110, the P channel is completed at the N-well located below the floating gate, that is, between the drain and the source, due to polarization. By having the voltage applied to the gate of NMOS 120 connected with PMOS 110 and having a channel formed between the source and the drain formed at NMOS 120, the pixel current is outputted by receiving a signal electric charge formed at PMOS 110. While one photon generates one EHP in the conventional CMOS image sensor, one photon induces an amplified channel current of PMOS in the PMOS 110 of the unit pixel 100. Accordingly, a current gain of photoelectric current reaches up to 100-1000, thereby allowing an image to be realized under a low illumination environment, in which a small amount of light is incident, and electric charges to be accumulated 100 to 1000 times faster than the conventional sensor. As a result, the time required for charge accumulation is sufficient with a delay of tens of clocks, rather than 1 frame or 1 line, thereby not requiring a long integration time and thus enabling a high-speed video to be realized.

Figure 2:
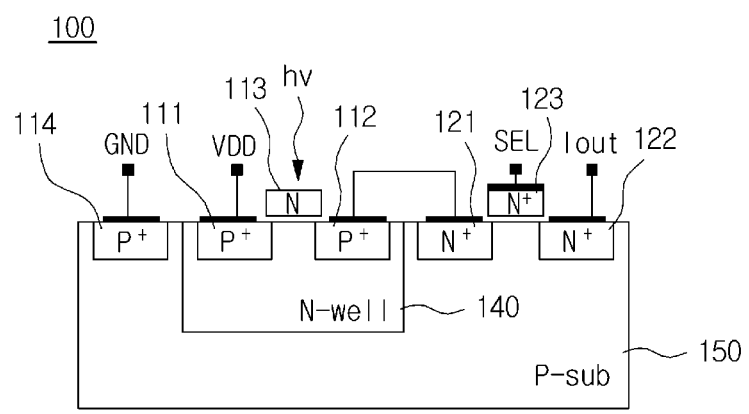
FIG. 2 is a brief illustration of a cross section of the circuit of the unit pixel of the image sensor shown in FIG. 1.

FIG. 2 is a brief illustration of a cross section of the circuit of the unit pixel of the image sensor shown in FIG. 1.

PMOS 110 is formed in N-well 140 formed in a P-type substrate 150, and the body thereof is floated. NMOS 120 is formed in the P-type substrate 150, and the body thereof is connected to ground voltage GND. PMOS 110 is constituted with a first P+ region 111 and a second P+ region 112 formed in the N-well 140, and a floating gate 113 formed above an insulating layer located between the first P+ region 111 and the second P+ region 112.

NMOS 120 is constituted with a first N+ region 121 and a second N+ region 122 formed in the P-type substrate 150, a control gate 123 formed above an insulating layer located between the first N+ region 121 and the second N+ region 122, and a third P+ region 114 formed in the P-type substrate 150. The first P+ region 111 operates as the source of PMOS 110 and has source voltage VDD applied thereto. The second P– region 112 operates as the drain of PMOS 110. The first N+ region 121 operates as the drain of NMOS 120 and is connected to the drain of PMOS 110. The second N+ region 122 operates as the source of NMOS 120 and is connected to IVC to output a pixel current. The control gate 123 is formed above the insulating layer located between the first N+ region 121 and the second N+ region 122. The third P+ region 114 is connected to ground voltage GND. Here, the ground voltage GND may be a reference voltage for NMOS 120 to operate as a switch. Moreover, the ground voltage GND may function to allow unit pixels to be isolated from one another. While a silicide layer for a metal contact is formed above the first to third P+ regions 111, 112, 113, the first and second N+ regions 121, 122 and the control gate 113, no silicide layer is formed above the floating gate 113 in order to impede the reflection of light and facilitate the absorption and transmittance of light. Moreover, since the silicide layer is formed for the purpose of ohmic contact, the silicide layer may function as a site for supplying free electrons to the floating gate 113. Therefore, the Nonsal structure, in which no silicide layer is formed above the floating gate 113, can not only facilitate the absorption and transmittance of light but also eliminate the effect caused by free electrons. Meanwhile, the IVC connected jointly to a column line outside the pixel may convert the pixel current outputted by driving a capacitor or a resistor to a voltage.

Figure 3:
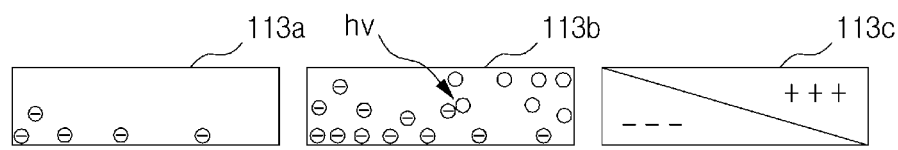
FIG. 3 illustrates a principle of operation of the unit pixel of the image sensor shown in FIG. 1.

FIG. 3 illustrates a principle of operation of the unit pixel of the image sensor shown in FIG. 1.

A floating gate 113 may be formed with an N-doped polysilicon and may have the thickness of 100 nm to 1 um so as to widen an absorption wavelength range of light. In the case where the floating gate 113 is manufactured according to the general MOSFET process, the floating gate 113 is formed with the thickness of 200-300 nm and absorbs most of the short wavelengths of 400 nm or less but transmits a significant amount of the long wavelength range, e.g., 500-1,100 nm, of visible light. Accordingly, in order to increase the absorption rate of the long wavelength range, which has a high transmissivity, the thickness of the floating gate 113 may be increased. By increasing the thickness of the floating gate 113, the probability of having an EHP generated in the floating gate 113 by light may be increased. Moreover, in a process supporting the PIP (polysilicon-insulator-polysilicon) capacitor method, an effect similar to having the thickness of the floating gate 113 increased may be achieved by laminating polysilicon and connecting the polysilicon vertically to use the polysilicon as a gate. Meanwhile, by increasing the thickness of the floating gate 113, it is possible to decrease the generation of an EHP by the light incident all the way to the inside of N-well and/or P-type substrate.

The floating gate 113a shown on the left side shows how electrons are distributed while light is not irradiated. In order to form a buried channel, which minimizes the generation of noise caused by a surface current, between a PMOS source and a PMOS drain, the floating gate 113a is N-doped. Here, the lower left side is positioned toward the PMOS source, and the lower right side is positioned toward the PMOS drain.

The floating gate 113b shown in the middle shows how an EHP is generated and how electrons and holes are polarized and distributed by an outside electric field when light is incident. In the floating gate 113b, the electrons separated from the holes can freely move outside a grain boundary of polysilicon and are aggregated at the lower left side of the floating gate 113b, i.e., near the PMOS source, due to an electric field effect of the PMOS source. As the electrons are aggregated, an electric field is formed at the lower left side of the floating gate 113b, and the more the electrons are aggregated, the stronger the electric field becomes. Meanwhile, as holes are pushed by the PMOS source and hole carriers of the channel and move to the upper right side of the floating gate 113b, i.e., away from the PMOS source, a polarization phenomenon is occurred within the floating gate 113b. When light is removed, the polarized electrons and holes are recoupled for a thermal equilibrium condition and become a state similar to the left side 113a.

The floating gate 113c shown on the right side has the polarization phenomenon occurred therein. The stronger the incident light, the more the EHPs are generated, hence a stronger polarization phenomenon. Once the electric field effect is applied to a lower surface of the floating gate 113c and an upper surface of the channel due to the polarization phenomenon of the floating gate 113c, the electric charge of the lower surface of the floating gate 113c is increased according to the intensity of the incident light, resulting in a greater electric field. Accordingly, the channel between the PMOS source and the PMOS drain is expanded, and the amount of current flowing through the channel is increased.

Figure 4:
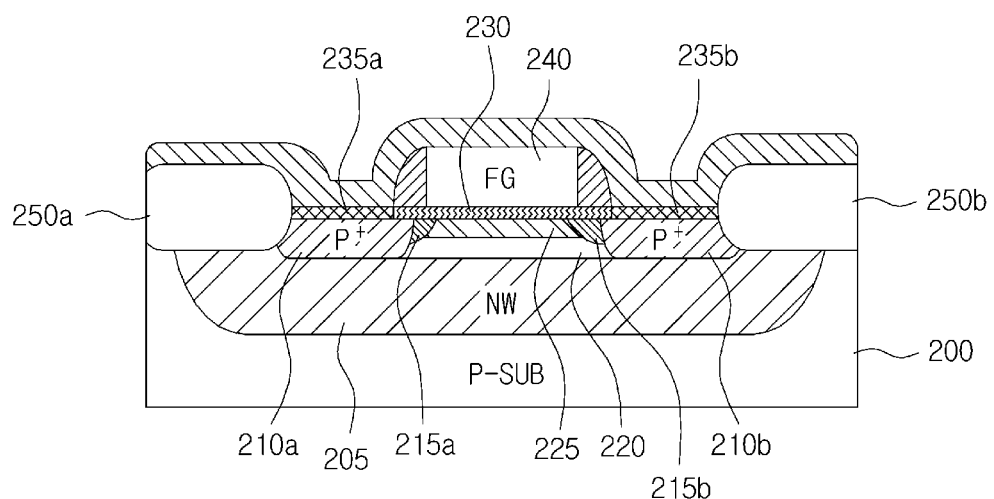
FIG. 4 illustrates an example of a structure of a light-receiving part of a unit pixel.

FIG. 4 illustrates an example of a structure of a light-receiving part of a unit pixel.

Referring to FIG. 4, an N-well 205 is formed by injecting N-type impurities in a P-type substrate 200, and in the N-well 205, a PMOS, which is constituted with a source, a drain, and a floating gate deposited with polysilicon after having an insulating layer formed above the N-well 205, is formed. By injecting P+ impurities in the N-well 205, a source 210a, which is a first P+ region, and a drain 210b, which is a second P+ region, are formed. The source 210a and the drain 210b are elements corresponding to each other and may be formed through a same process. Silicide layers 235a, 235b are formed, respectively, above the source 210a and the drain 210b. An insulating layer 230 is formed in between the silicide layers 235a, 235b, and a floating gate 240 made of polysilicon is formed above the insulating layer 230. Lightly-doped drains (LDD) 215a, 215b are formed, respectively, on the right side of the source 210a and the left side of the drain 210b. Spacers 245a, 245b are formed, respectively, on lateral surfaces of the floating gate 240 for preventing injection of the P+ impurities. Meanwhile, a channel layer 225, in which a buried channel is formed, is formed in the N-well 205, and a carrier separation preventing layer 220, in which doping concentration is lowered in order to prevent a carrier generated in the channel from entering an adjacent MOS, is formed below the channel layer 225. The left side of the source 210a and the right side of the drain 210b are regions 250a, 250b for electrically separating the PMOS constituting the light-receiving part from another, adjacent MOS and may be each formed through, for example, a local oxidation of silicon (LOCOS) or shallow trench isolation (STI) method. A passivation layer 255 is formed above the light-receiving part.

In an exemplary embodiment, an epitaxial wafer may be used for uniformity of the N-well 205. The light-receiving part shown in FIG. 4 uses the principle that electric charges are polarized by an interaction between EHPs excited by light and a bias terminal and a channel caused by an electric field is formed below the floating gate 240 by the quantity of polarized electric charges. Here, the bias terminal is the source 210a in the case of PMOS. In the structure shown in FIG. 4, Vt is affected by the doping concentration of the N-well 205. Accordingly, if the characteristics of the unit pixel are not uniform in a pixel array for an image sensor, the quality of image may be deteriorated. The epitaxial waver may be used for increasing the uniformity of the characteristics of unit pixels, for example, the uniformity of Vt. Since Vt is proportional to the doping concentration, the doping concentration of the N-well 205 may be adjusted for the operation of the light-receiving part.

In an exemplary embodiment, in order to prevent the quantity of electric charges of the floating gate 240 from being changed by tunneling, the insulating layer 230 may be made of a high-K dielectric. Here, the high-K dielectric may be, but not limited to, for example, $Al_2O_3$, $HfSiO_x$, or HfSiON (nitrided hafnium silicates).

In another exemplary embodiment, in order to prevent the quantity of electric charges of the floating gate 240 from being changed by tunneling, the insulating layer 230 may be made of a low-K dielectric. Generally, in a process not using copper, for example, a 0.11 um process, a gate leakage is reduced using fluorine silicon glass (FSG) or undoped silicon dioxide (USG). In the case where using the high-K dielectric to manufacture the light-receiving part is impossible or would increase the manufacturing costs, it is possible to prevent the tunneling by using the low-K dielectric material if USG is used.

In an exemplary embodiment, in order to prevent the quantity of electric charges of the floating gate 240 from being changed by tunneling, it is possible to lower the doping concentration of LDD 215a, 215b. Generally, the common doping concentration of LDD is $1 \times 10^{15}$ or less, but since the doping concentration of LDD varies according to the process, the doping concentration may be lowered to be less than the doping concentration applied in the pertinent process. By lowering the doping concentration of LDD 215a, 215b, a voltage drop is occurred due to a relatively high resistance, possibly resulting in a lowered electric field between LDD 215a and the gate 240. In order to lower the doping concentration of LDD 215a, 215b, in the case of PMOS, LDD 215a, 215b may be lightly doped to be P−.

Figure 5:
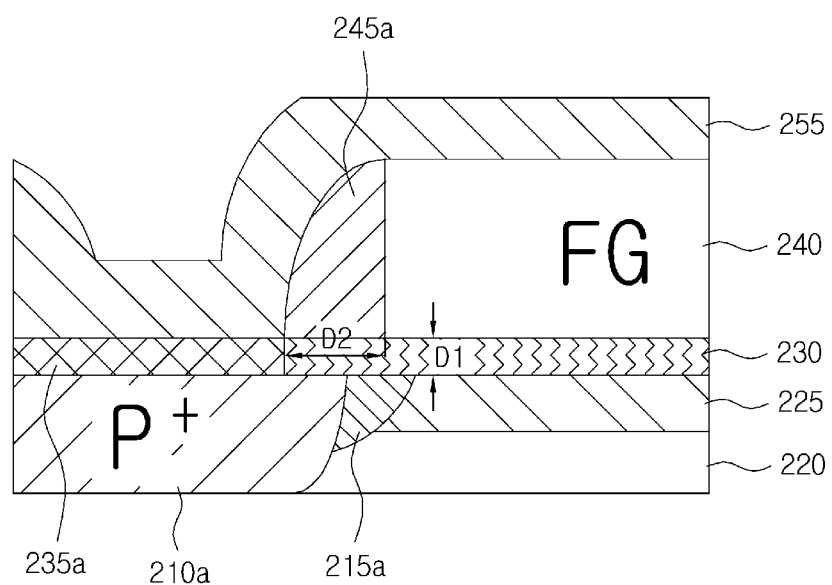
FIG. 5 is a detailed illustration of a structure of an edge portion of a gate shown in FIG. 4.

FIG. 5 is a detailed illustration of a structure of an edge portion of a gate shown in FIG. 4. Referring to FIG. 5, the source 210a operating as the bias terminal and the lower left portion of the floating gate 240 are illustrated. As the drain 210b and the lower right portion of the floating gate 240 are structured in the same way, the drain 210b and the lower right portion of the floating gate 240 will not be described redundantly herein.

In an exemplary embodiment, in order to prevent the quantity of electric charges of the floating gate 240 from being changed by tunneling, it is possible to have a thickness D1 of the insulating layer 230 increased. Here, the insulating layer may be made of, for example, silicon oxide ($SiO_2$). When tunneling is occurred between the floating gate 240 and the source 210a and electrons are escaped to the source 210a, positive electric charges are increased at the floating gate 240, possibly resulting in a decrease of the current flowing through the channel. Therefore, tunneling may cause a negative effect to the operation of the light-receiving part of the unit pixel shown in FIG. 4. Moreover, due to the tunneling, which causes the electrons to escape from the floating gate 240 to the source 210a, an afterimage effect and/or a memory effect may be caused by the electrons being flowing in and out in a delayed fashion. Here, the memory effect is a phenomenon in which an image similar to being exposed to light is visible even if the power is turned off and then on because electric charges continue to be trapped in a defects site of the floating gate 240 or inside the insulating layer 230. Therefore, the tunneling may be prevented by increasing the distance between the lower left edge of the floating gate, where the electrons are aggregated, and the LDD 215a by increasing the thickness D1 of the insulating layer 230. Here, in the case of a general MOS that operates in 3.3 V, the thickness of an insulating layer is 7 nm or less, and the thickness of the insulating layer 230 may be increased by about 20%, for example, to about 7 to 10 nm. Meanwhile, in the case of 1.5 V, the thickness of the insulating layer 230 may be, for example, 4 to 6 nm.

In an exemplary embodiment, in order to impede the reflection of light and facilitate the absorption and transmittance of light, the floating gate 240 may have a nonsal structure, in which no silicide layer is formed above the floating gate 240. In order to keep a silicide layer from forming above the floating gate, a silicide protective layer (not shown) that is wider than the floating gate 240 may be formed above the floating gate 240 when a silicide layer is formed above the source 210a and the drain 210b. Here, the silicide protective layer may be expanded as long as there is no problem for the silicide layers 235a, 235b formed above the drain 210a and the source 210b, respectively, to have a metal contact. Accordingly, the length of the insulating layer 230 may be increased by D2. As a result, it is possible to allow the silicide layer to be formed at a portion above the floating gate 240 or to keep one side of the lower portion of the floating gate 240 from being in contact with the silicide layers 235a, 235b formed above the source 210a and the drain 210b. If the silicide layer is formed at a portion above the floating gate 240 due to, for example, a mismatch in mask, it is possible to interfere with the light from being incident. Meanwhile, if the lower portion of the floating gate 240 is in contact with the silicide layers 235a, 235b or the silicide layer is formed above the floating gate 240, the silicide layer may function as a site for supplying free electrons, thereby possibly causing a uniformity problem among pixels. The conventional JUST method, in which areas of the mask and the floating gate are matched, may possibly cause a problem with yield in the case of a mass production and may cause the uniformity problem among the pixels because the silicide layer may be formed at a portion of the floating gate.

In an exemplary embodiment, the floating gate 240 may be formed to be thick in order to increase an absorption rate of the light. If the floating gate 240 is manufactured using the general MOSFET process, most of shortwaves of 400 nm are absorbed by the floating gate 240, but a very small portion of long wavelength band, for example between 500 and 1,100 nm, of visible light is absorbed and a significant portion of the long wavelength band is transmitted. Therefore, in order to increase the absorption rate of the long wavelength band, which has a high transmissivity, the thickness of the floating gate 240 may be increased. Owing to the increased thickness of the floating gate 240, it is possible that EHPs generated in the floating gate 240 by the incident light may be increased.

In an exemplary embodiment, the floating gate 240 may be doped to be nearly intrinsic. When the floating gate 240 is doped against the polarity of the floating gate 240 in order to form a buried channel, it is possible to dope the floating gate 240 to be nearly intrinsic. For example, in the case of realizing the light-receiving part with PMOS, the floating gate of PMOS may be doped with N-type impurities, and in the case of realizing the light-receiving part with NMOS, the floating gate of NMOS may be doped with P-type impurities, to form the buried channel. Here, being intrinsic does not exclusively mean that the concentration of the impurities is less than a specific value, for example, $1e10/cm^3$, but may include the case where the concentration of the N-type impurities is substantially identical with that of the P-type impurities. Accordingly, when no light is incident, the amount of polarized electric charges caused by the generation of EHPs may be kept at a minimum. By minimizing the amount of polarized electric charges, it is possible to lower the electric field between the LDD 215a, 215b and the floating gate 240.

Figure 6:
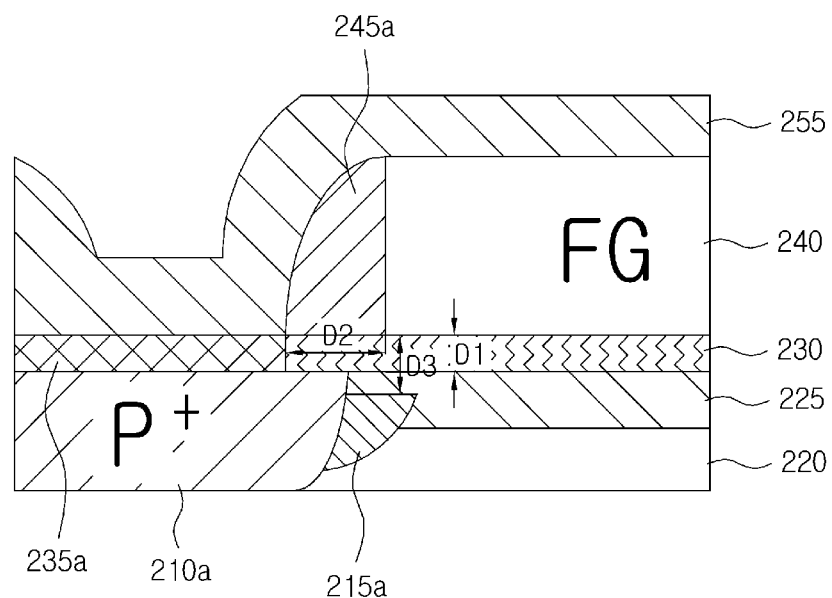
FIG. 6 is another detailed illustration of a structure of an edge portion of a gate shown in FIG. 4.

FIG. 6 is another detailed illustration of a structure of an edge portion of a gate shown in FIG. 4. Referring to FIG. 6, the drain 210a operating as the bias terminal and the lower left portion of the floating gate 240 are illustrated. As the source 210b and the lower right portion of the floating gate 240 are structured in the same way, the source 210b and the lower right portion of the floating gate 240 will not be described redundantly herein.

In an exemplary embodiment, in order to prevent the quantity of electric charges of the floating gate 240 from being changed by tunneling, it is possible to form the LDD 215a to be deep. In order to form the LDD 215a at a depth D3 (>D1) from a top surface of the substrate, the LDD 21a is formed by increasing LDD acceptor implant energy. By increasing the LDD acceptor implant energy, the LDD 215a may be formed at a depth in such a way that a top surface of the LDD 215 is not in contact with the insulating layer 230. As a result, it is possible to impede the tunneling phenomenon by increasing the distance D3 between the edge at the lower left portion of the floating gate 240 and the LDD 215a.

Figure 7:
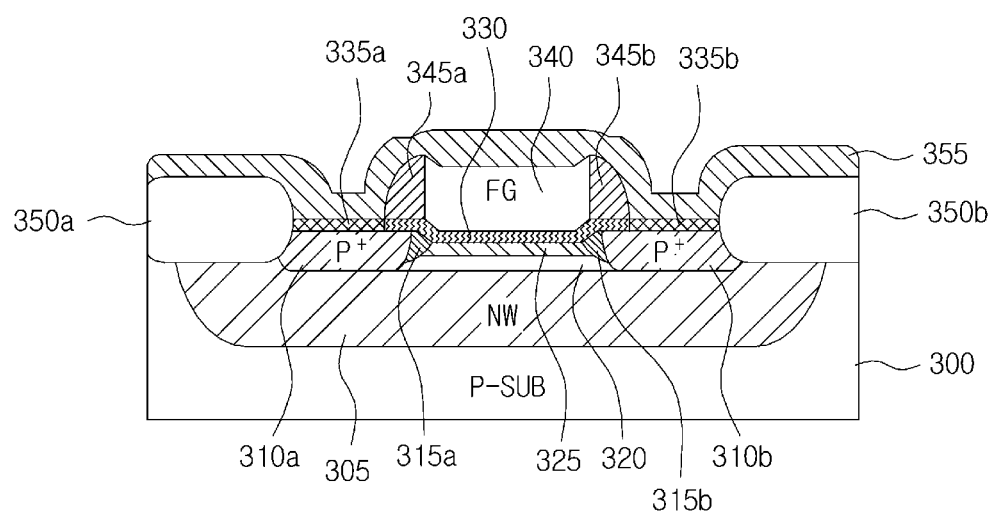
FIG. 7 illustrates an example of another structure of a light-receiving part of a unit pixel.

FIG. 7 illustrates an example of another structure of a light-receiving part of a unit pixel.

Referring to FIG. 7, the light-receiving part of the unit pixel is a PMOS constituted with, a source and a drain formed in the N-well 305 formed by injecting N-type impurities in a P-type substrate 300, and a floating gate 340 formed above an insulating layer located between the source and the drain. The source 310a and the drain 310b are formed by injecting P+ impurities in the N-well 305. The source 310a and the drain 310b are elements corresponding to each other and may be formed through a same process. Silicide layers 335a, 335b are formed, respectively, above the source 310a and the drain 310b in order for metal contact. An insulating layer 330 is formed in between the silicide layers 335a, 335b, and a floating gate 340 made of polysilicon is formed above the insulating layer 330. Here, the lower edges of the floating gate 340 may be formed in a planar shape. Lightly-doped drains (LDD) 315a, 315b are formed, respectively, on the right side of the source 310a and the left side of the drain 310b. Spacers 345a, 345b are formed, respectively, on lateral surfaces of the floating gate 340 for preventing injection of the P+ impurities. Meanwhile, a channel layer 325, in which a buried channel is formed, is formed in the N-well 305, and a carrier separation preventing layer 320, in which doping concentration is lowered in order to prevent a carrier generated in the channel from entering an adjacent MOS, is formed below the channel layer 325. The left side of the source 310a and the right side of the drain 310b are regions 350a, 350b for electrically separating the PMOS constituting the light-receiving part from another, adjacent MOS and may be each formed through, for example, a LOCOS or STI method.

In an exemplary embodiment, an epitaxial wafer may be used for uniformity of the N-well 305. In an exemplary embodiment, in order to prevent the quantity of electric charges of the floating gate 340 from being changed by tunneling, the insulating layer 330 may be made of a high-K dielectric. In an exemplary embodiment, in order to prevent the quantity of electric charges of the floating gate 340 from being changed by tunneling, the insulating layer 330 may be made of a low-K dielectric. In an exemplary embodiment, in order to prevent the quantity of electric charges of the floating gate 340 from being changed by tunneling, it is possible to lower the doping concentration of LDD 315a, 315b. In an exemplary embodiment, in order to impede the reflection of light and facilitate the absorption and transmittance of light, the floating gate 340 may have a nonsal structure, in which no silicide layer is formed above the floating gate 340. In an exemplary embodiment, the floating gate 340 may be formed to be thick in order to increase an absorption rate of the light. In an exemplary embodiment, the floating gate 340 may be doped to be nearly intrinsic.

Figure 8:
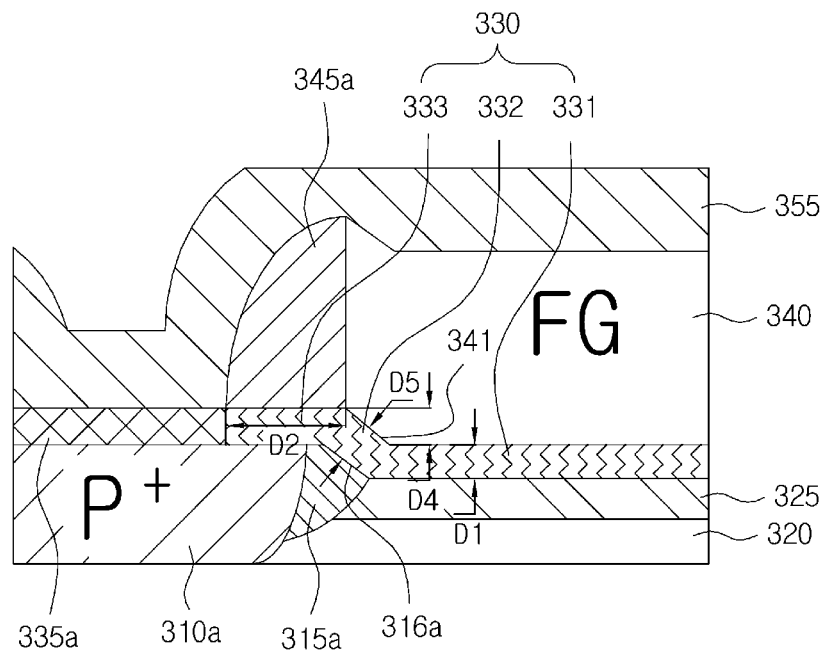
FIG. 8 is a detailed illustration of a structure of an edge portion of a gate shown in FIG. 7.

FIG. 8 is a detailed illustration of a structure of an edge portion of a gate shown in FIG. 7. Illustrated in FIG. 8 are the source 310 operating as a bias terminal and a lower left portion of the floating gate 340. As the drain 310b and the lower right portion of the floating gate 340 are structured in the same way, the drain 310b and the lower right portion of the floating gate 340 will not be described redundantly herein.

In order to keep an electric field from being concentrated at a particular portion, the edge at the lower left portion of the floating gate 340 may be formed as a plane 341. The edge of the floating gate 340 may be formed as the plane 341 by forming a shallow trench between the source 310a and the drain 310b and then forming the insulating layer 330, as illustrated in FIG. 9 to FIG. 16, or by forming a protrusion at a portion of the insulating layer 330 where the edge of the floating gate 340 is placed and then forming the floating gate 340, as illustrated in FIG. 17 to FIG. 21.

When the lower left edge of the floating gate 340 is formed to the plane 341 using the trench, the insulating layer 330 may be constituted with a first insulating layer 331, a second insulating layer 332 and a third insulating layer 333. The first insulating layer 331 is placed between a bottom surface of the floating gate 340 and the channel layer 325 and is formed at a depth D4, which is deeper into the substrate than the third insulating layer 333. The second insulating layer 332 connects the first insulating layer 331 with the third insulating layer 333 and is formed with a thickness D5 along the plane 341 at the lower left portion of the gate 340 and an inclined plane 316a of the LDD 315a. The third insulating layer 333 is parallel with the silicide layer 335a and is formed with a length D2. Here, as a thickness D1 and the thickness D5 may be substantially identical with each other, the distance to the LDD may not be substantially changed, but the intensity of the electric field applied to the LDD may be weakened, compared to the case when the lower left portion of the floating gate 340 is formed in a sharp edge.

By forming the lower left portion of the floating gate 340 as the plane 341, electrons are not concentrated but are dispersed along the plane 341, and thus it is possible to improve the phenomenon of having the electric field appeared strongly at a particular portion. In the general MOSFET, having the electric field applied strongly at a particular portion may cause a leakage problem due to a hot carrier caused by a thermal effect or a problem of having the electrons trapped in a defect. On the contrary, since the proposed unit pixel is structured to control a very small quantity of current by photons, an afterimage effect may be occurred due to tunneling or hot carrier. Therefore, in order to prevent this, the edge at the lower left portion of the floating gate 340 where the electric field may be concentrated may be formed as a plane.

FIG. 9 to FIG. 16 illustrate an example of processes of manufacturing the light-receiving part of the unit pixel of the image sensor shown in FIG. 7.

Figure 9:
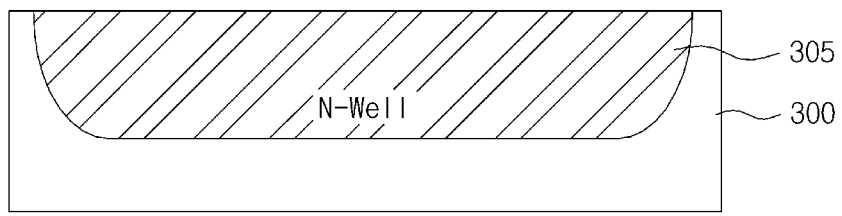
FIG. 9, FIG. 10, FIG. 11, FIG. 12, FIG. 13, FIG. 14, FIG. 15 and FIG. 16 illustrate an example of processes of manufacturing the light-receiving part of the unit pixel of the image sensor shown in FIG. 4.

In FIG. 9, an N-well 305 is formed on a P-type substrate 300. The N-well 305 may be formed by implanting, for example, P impurities.

Figure 10:
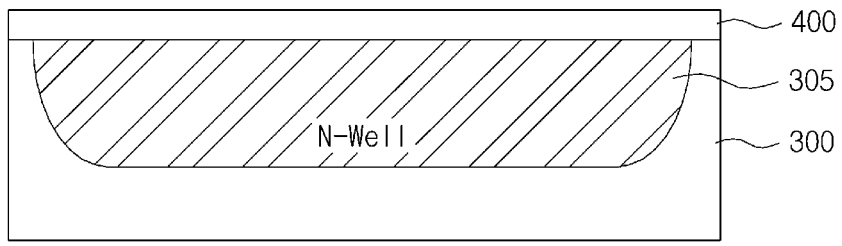

In FIG. 10 a silicon nitride layer 400 is formed on an upper surface of the P-type substrate 300 having the N-well 305 formed thereon.

Figure 11:
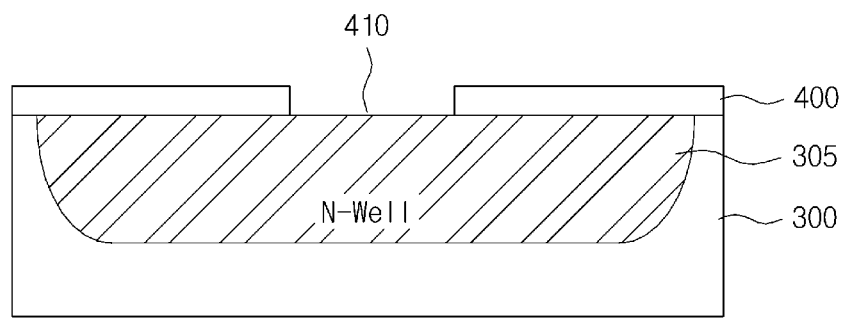

In FIG. 11, in order to form a trench, an opening 410 is formed by partially removing the silicon nitride layer 400 formed on the upper surface of the N-well 305.

Figure 12:
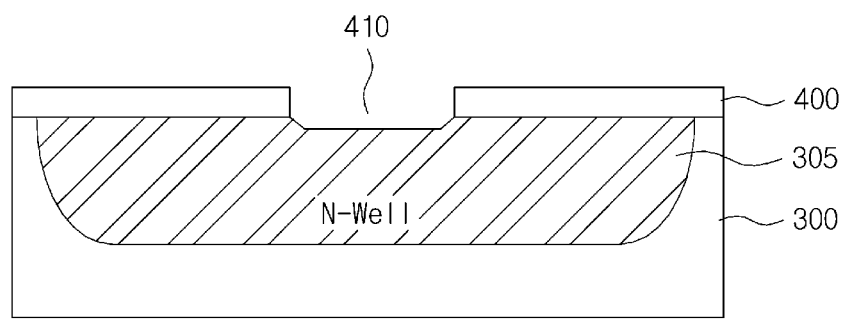

In FIG. 12, a trench 415 is formed by etching the N-well 305 located in the opening 410.

Figure 13:
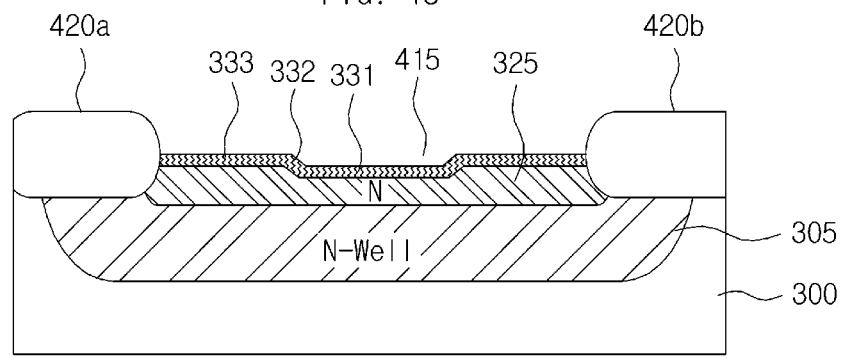

In FIG. 13, the silicon nitride layer 400 is removed, and insulating layers 331, 332, 333 are formed on the upper surface of the P-type substrate 300 having the trench 415 formed therein. The insulating layers 331, 332, 333 are also formed on a bottom surface and an inclined surface of the trench 415. Moreover, LOCOS 420a, 420b are formed, respectively, on the left side and the right side of the trench 415. After the insulating layers 331, 332, 333 are formed, a channel layer 325 is formed by performing an implant for adjusting Vt of the N-well.

Figure 14:
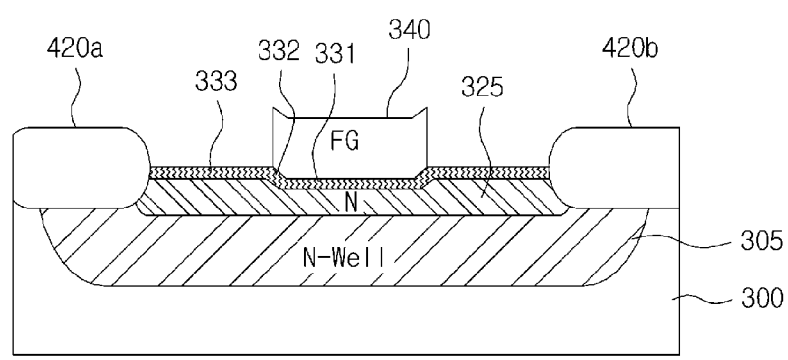

In FIG. 14, a gate 340 is formed with polysilicon in the trench 415 having the insulating layers 331, 332, 333 formed thereon. Here, when the gate is formed, a top portion of the gate may be made to be flat. A gate formed through a general MOSFET process has a top portion thereof etched in a round shape. If the top portion of the gate is not flat, there is no operational problem in the case of a general electronic device, but in the case of an image sensor, this may cause a big problem in the uniformity of pixels. Therefore, considering that polysilicon located at both lower ends of photoresist may be etched by an etchant during a wet etching process after deposition of polysilicon, the photoresist may be deposited much wider. Moreover, by mixing dry etching and wet etching, instead of isotropic wet etching, the etched surface on the top portion of the gate may be made to be flat.

Figure 15:
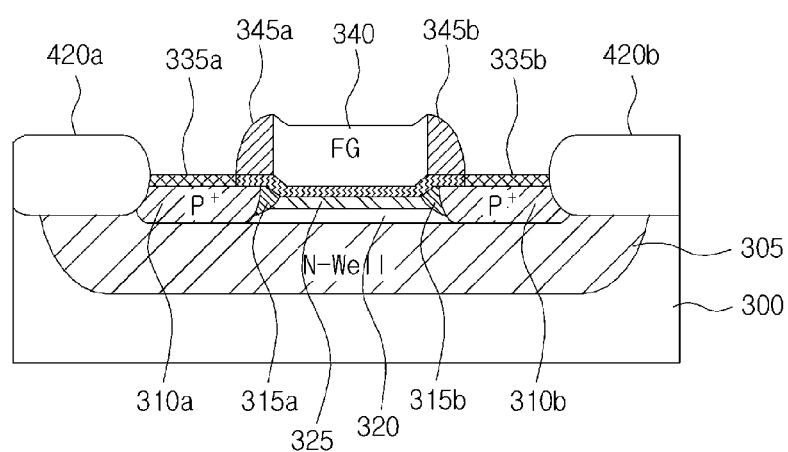

In FIG. 15, LDD 315a, 315b are formed by injecting P− impurities in the N-well. Afterwards, by injecting P+ impurities, a source 310a and a drain 310b are formed. When the P− impurities and the P+ impurities are injected, P-type impurities may be possibly injected into the gate also, and by injecting N-type impurities through a separate process, the gate may be substantially doped to be nearly intrinsic. Meanwhile, a separate mask may be used in order to prevent the gate from being doped to the P type when the P− impurities and/or the P+ impurities are injected. After forming the source 310a and the drain 310b, silicide layers 335a, 335b for metal contact are formed above the source 310a and the drain 310b. The silicide layers 335a, 335b are formed after removing the insulating layers above the source 310a and the drain 310b. Here, no silicide layer is formed above the gate 340 of PMOS.

Figure 16:
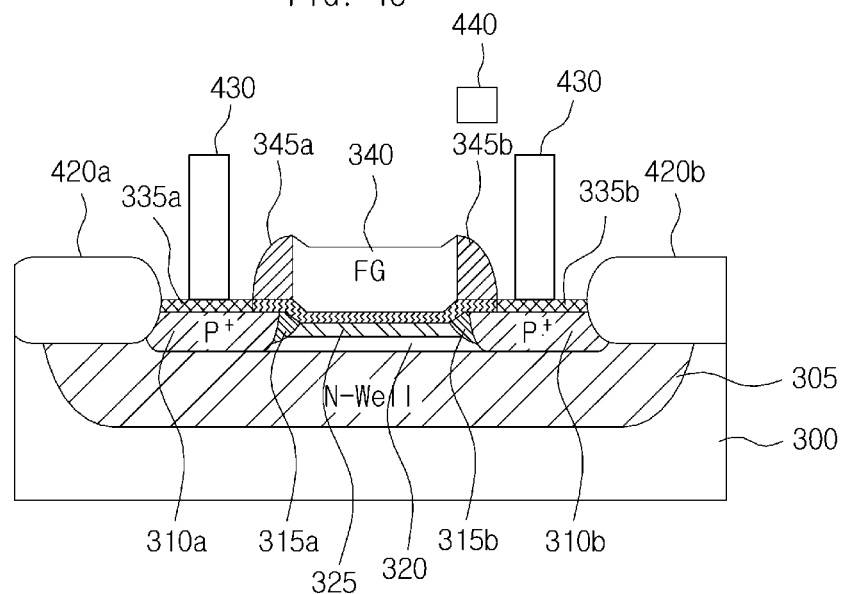

In FIG. 16, metal wiring is made in order to output electric signals from the unit pixel. That is, a metal 430 is formed to be connected with the source 310a and the drain 310b of PMOS to transfer electric signals to an outside. When a contact is made with the source 310a and the drain 310b using the metal 430, the position of the contact may be separated as much as possible from the gate 340. The farther the contact is from the gate 340, the more the electric field affecting the gate 340 may be reduced. Meanwhile, it is possible to form a polarization inducing structure, which facilitates a polarization phenomenon using the metal around the gate 340 for shielding the light. The polarization inducing structure may be constituted with a metal 440 around the gate 340 that is disposed at a position capable of allowing an electric field to act at an upper right portion of the gate 340, and the metal 440 does not make contact with the drain 310b. When light is incident and electric signals are outputted from the unit pixel, the metal 440 is connected to ground voltage GND to allow holes to be aggregated at the upper right portion of the gate 340. In contrast, when light is not incident or the amount thereof is reduced, the metal 440 is connected to VDD and push the holes to the lower left portion of the gate 340 to increase the recombination rate and combination speed of electron hole pairs. When a select transistor NMOS 120 is off, the drain 310b is floated, and the source 310a and the drain 310b have a same value to maintain an equilibrium state. Here, polarization of electric charges may be formed vertically at the gate 340, unlike (c) of FIG. 3. Therefore, using the polarization inducing structure, the metal 440 is connected to the source voltage VDD when the select transistor NMOS 120 is off, and an electric field effect may be induced to increase the recombination rate and combination speed of the electron-hole pairs so that the equilibrium state such as 113a of FIG. 3 may be regained.

FIG. 17 to FIG. 21 illustrate an example of processes of forming a lower edge of a gate of a unit pixel into a plane. To avoid any redundant description, the description of NMOS will be omitted.

Figure 17:
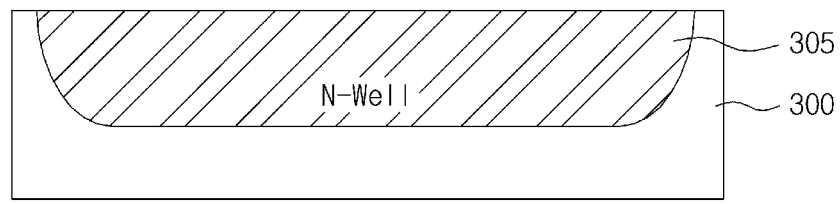
FIG. 17, FIG. 18, FIG. 19, FIG. 20 and FIG. 21 illustrate an example of processes of forming a lower edge of a gate of a unit pixel into a plane.

In FIG. 17, an N-well 305 is formed on a P-type substrate 300. The N-well 305 may be formed by injecting, for example, P impurities.

Figure 18:
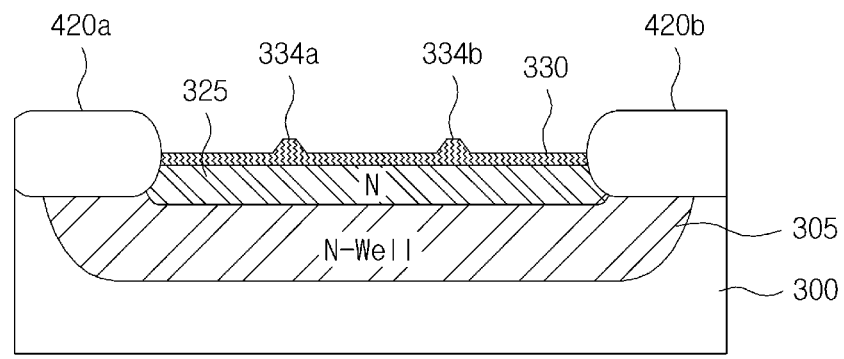

In FIG. 18, an insulating layer 330 and LOCOS 420a, 420b are formed, and a channel layer 325 is formed by performing an implant for adjusting Vt of the N-well, and then protrusions 334a, 334b are formed through additional processes, such as photoresist and etching, above the insulating layer 330 where a gate 340 is to be formed. For example, in the case where the insulating layer 330 is formed with $SiO_2$, an $SiO_2$ isotropic etching may be made to the insulating layer 330 to form the protrusions 334a, 334b where lower edges of the gate 340 are to be positioned. Here, lateral surfaces of each of the protrusions may be each formed in an inclined surface.

Figure 19:
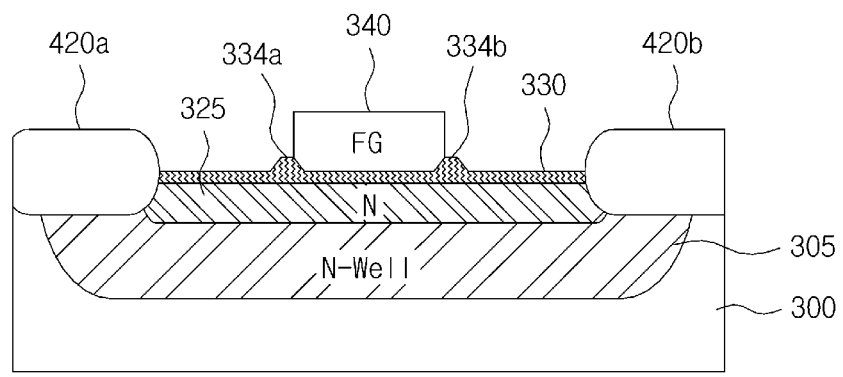

In FIG. 19, the gate 340 is formed with polysilicon between the protrusions 334a, 334b. Here, the lower edges of the gate 340 are placed, respectively, on the inclined surfaces of the protrusions 334a, 334b that face opposite to each other. Accordingly, the lower edges of the gate 340 may be each formed in a plane. Meanwhile, a top portion of the gate may be made flat when the gate is formed. Considering that polysilicon located at both lower ends of photoresist may be etched by an etchant during a wet etching process after deposition of polysilicon, the photoresist may be deposited much wider. Moreover, by mixing dry etching and wet etching, instead of isotropic wet etching, the etched surface on the top portion of the gate 340 may be made to be flat.

Figure 20:
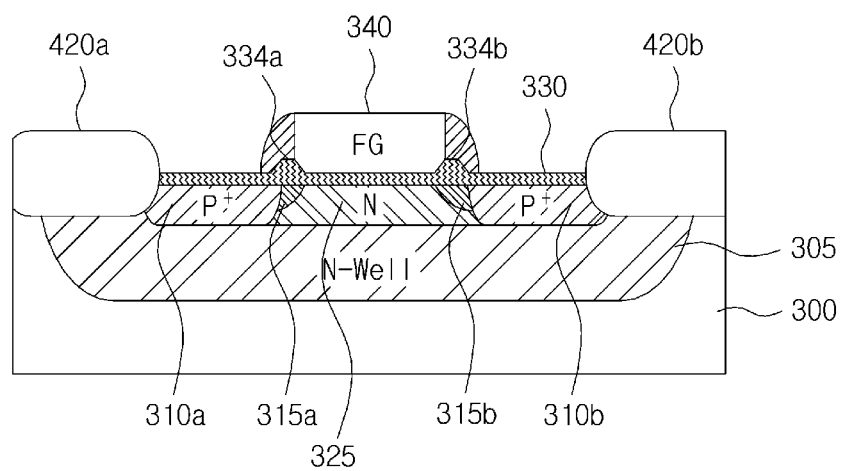

In FIG. 20, in order to form a source and a drain, LDD 315a, 315b and P+ regions 310a, 310b are formed by injecting P-type impurities. When the P-type impurities are injected, the P-type impurities may be possibly injected into the gate also, and by injecting N-type impurities through a separate process, the gate may be substantially doped to be nearly intrinsic. Meanwhile, a separate mask may be used in order to prevent the gate from being doped to the P type when the P− impurities and/or the P+ impurities are injected.

Figure 21:
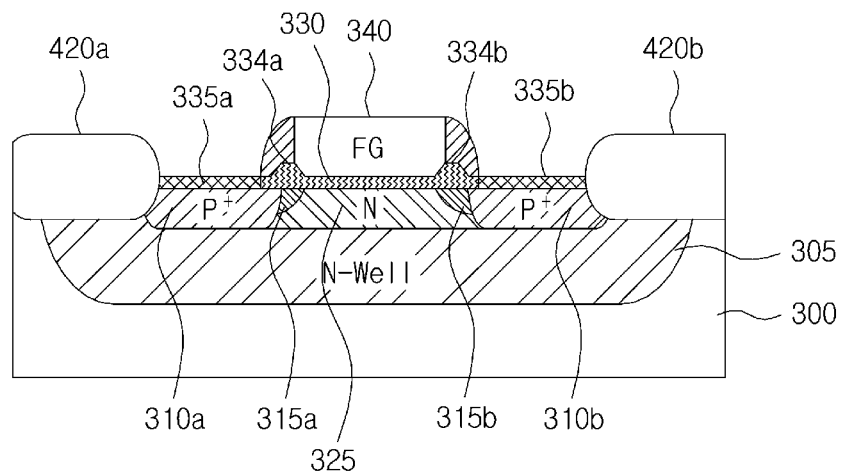

In FIG. 21, silicide layers 335a, 335 for metal contact are formed above the P+ regions 310a, 310b. Here, no silicide layer is formed above the gate 340.

FIG. 22 to FIG. 25 illustrate another example of processes of forming a lower edge of a gate of a unit pixel into a plane.

Figure 22:
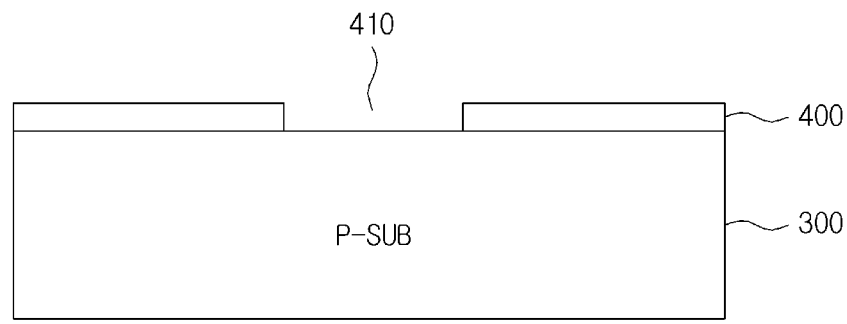
FIG. 22, FIG. 23, FIG. 24 and FIG. 25 illustrate another example of processes of forming a lower edge of a gate of a unit pixel into a plane.

In FIG. 22, a silicon nitride layer 400 is formed on a top surface of a P-type substrate 300, and an opening 410 is formed using a mask at a location where a shallow trench is to be formed.

Figure 23:
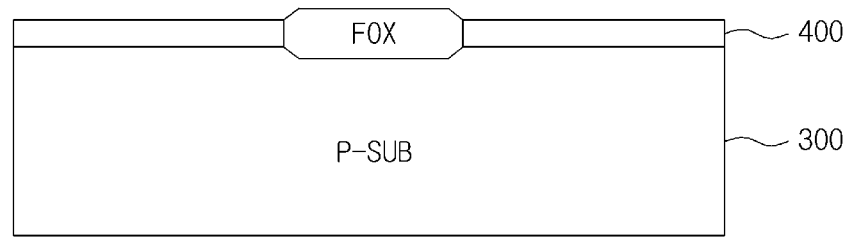

In FIG. 23, FOX (field oxide) is formed in the opening 410.

Figure 24:
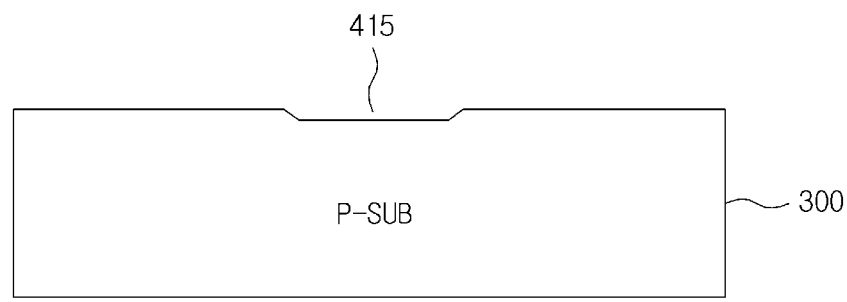

In FIG. 24, a trench 415 is formed by removing the silicon nitride layer 400 and FOX. Lateral surfaces on both sides of the trench 415 may be each formed in an inclined surface.

Figure 25:
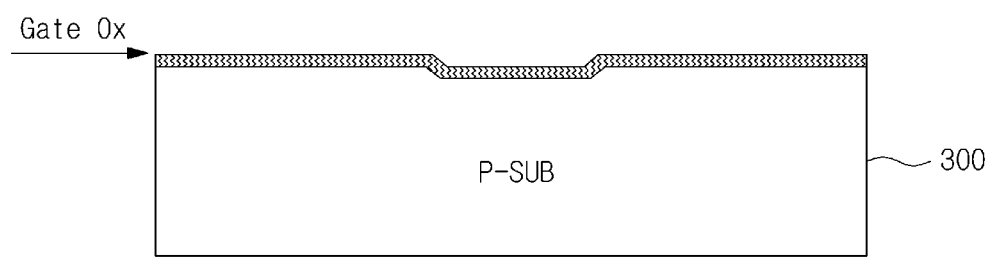

In FIG. 25, an insulating layer is formed on a top portion of the P-type substrate 300 and on lateral surfaces and a bottom surface of the trench 415. Afterwards, in order to form PMOS, an N-well, a gate, LDD, P+ regions, silicide layers are successively formed. Steps (a) to (d) may be carried out on a bare wafer before the elements constituting PMOS are formed and thus may have little effect on other processes following thereafter. Meanwhile, the present process using FOX is identical with a LOCOS process, except for the depth, and thus the LOCOS process may be performed after FIGS. 22 to 25.

FIG. 26 to FIG. 29 illustrate yet another example of processes of forming a lower edge of a gate of a light-receiving part of a unit pixel into a plane.

Figure 26:
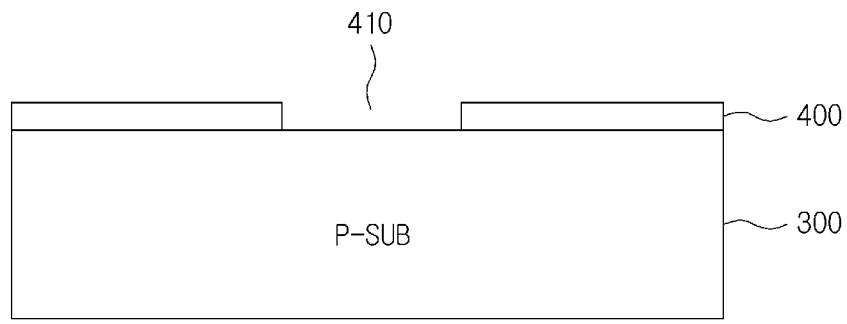
FIG. 26, FIG. 27, FIG. 28 and FIG. 29 illustrate yet another example of processes of forming a lower edge of a gate of a unit pixel into a plane.

In FIG. 26, a silicon nitride layer 400 is formed on a top surface of a P-type substrate 300, and an opening 410 is formed using a mask at a location where a trench is to be formed.

Figure 27:
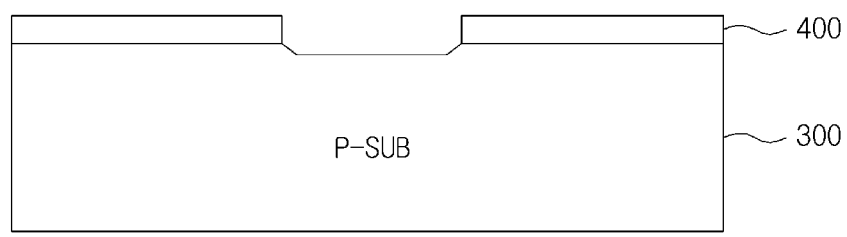

In FIG. 27, a trench 415 is formed using an etching with, for example, KOH. For more precision, the trench 415 may be formed by applying anisotropic etching that is used in a MEMS process. Lateral surfaces on both sides of the trench 415 may be each formed in an inclined surface.

Figure 28:
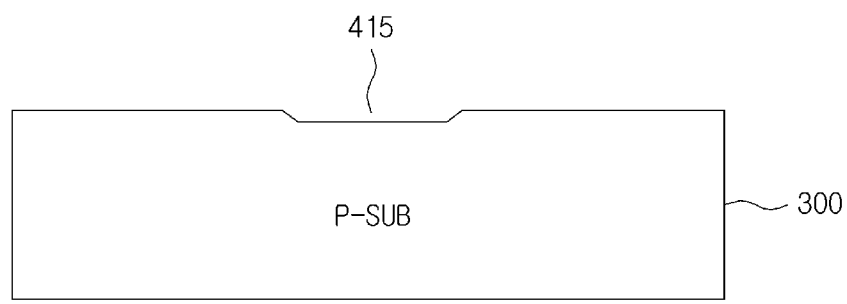

In FIG. 28, the silicon nitride layer 400 is etched off, and a conventional CMOS process is used by providing a wafer such that a general CMOS process may be carried out.

Figure 29:
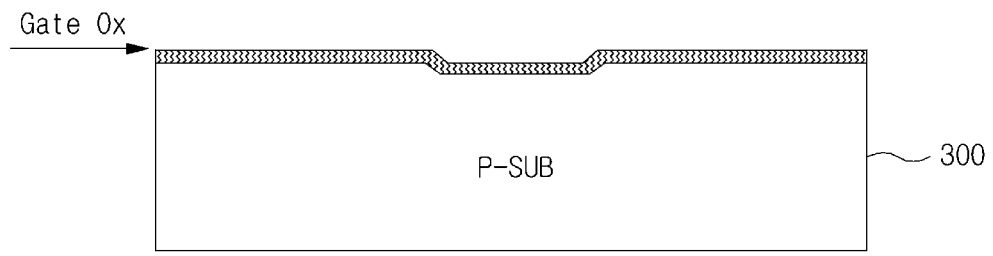

In FIG. 29, an insulating layer is formed on a top surface of the P-type substrate 300 and on lateral surfaces and a bottom surface of the trench 415. Afterwards, in order to form PMOS, an N-well, a gate, LDD, P+ regions, silicide layers are successively formed. FIG. 26 to FIG. 29 may be carried out on a bare wafer before the elements constituting PMOS are formed and thus may have little effect on other processes because it would be unnecessary to apply a special process, such as MEMS, during a general CMOS process if a wafer pre-processed through the MEMS process were used. Moreover, as this process can mitigate a phenomenon of a top portion of the gate becoming curved due to isotropic etching, it is possible to reduce a deviation in volume of the gate caused by the formation of the curve.

Figure 30:
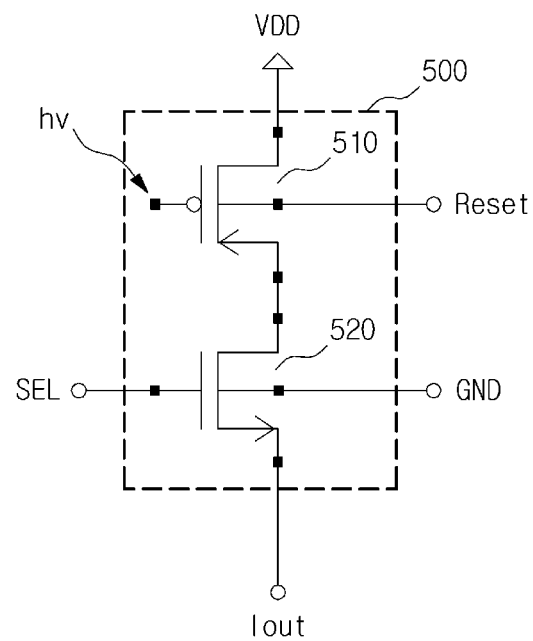
FIG. 30 illustrates another example of a circuit of a unit pixel of an image sensor.

FIG. 30 illustrates another example of a circuit of a unit pixel of an image sensor.

A unit pixel 500 performs photoelectric conversion of light to output a pixel current. For this, the unit pixel 500 is constituted with PMOS 510, which functions as a light-receiving part for photoelectric conversion of incident light, and NMOS 520, which is connected to PMOS 510 to function as a switch. Here, PMOS 510 controls the amount of the pixel current flowing through a channel formed between a source and a drain by an electric field that is generated by a floating gate that is polarized by the incident light, and NMOS 520 functions as a select transistor to perform the function of selecting the unit pixel 500 to output the pixel current and determine an exposure time.

The source of PMOS 510 is coupled to source voltage VDD, and the drain thereof is coupled to a drain of NMOS 520. The body of PMOS 510 has a contact formed thereon for connection with an outside, and the body of NMOS 520 may be connected to ground voltage GND. The source of NMOS 520 outputs the pixel current, and the outputted pixel current may be applied to an IVC (I-V Converter). PMOS 510 and NMOS 520 may be realized through a general MOSFET process.

Figure 31:
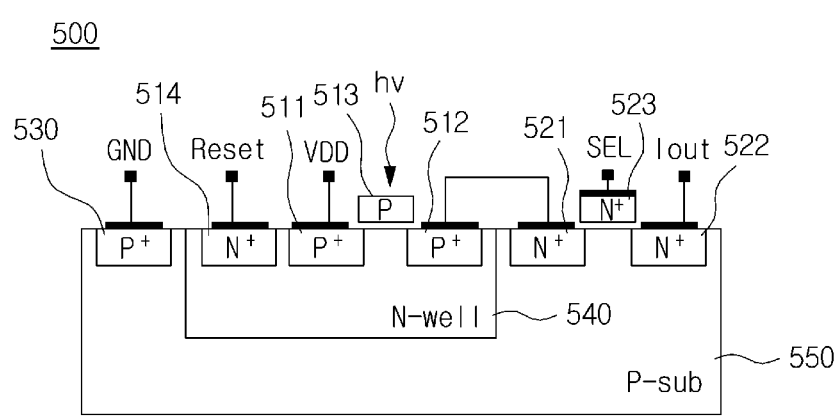
FIG. 31 illustrates a cross section of the circuit of the unit pixel of the image sensor shown in FIG. 30.

FIG. 31 illustrates a cross section of the circuit of the unit pixel of the image sensor shown in FIG. 30.

Referring to FIG. 31, an N-well 540 is formed in a P-type substrate 550, and PMOS 510 constituting a unit pixel 500 is formed in the N-well 540, and NMOS 520 is formed in the P-type substrate 550.

A floating gate 513 is formed above an insulating layer placed between a source 511 and a drain 512 of PMOS 510. By having the gate 513 floated, it is possible to facilitate recombination of EHPs in order to maintain a thermal equilibrium state when light is disappeared. The source 511, which is a first P+ region, and the drain 512, which is a second P+ region, are formed by injecting P+ impurities in the N-well 540, and the floating gate 513 may have a concentration of impurities thereof adjusted by doping polysilicon with N− impurities. The floating gate 513 may become a P type, intrinsic or an N type, depending on the concentration of the N− impurities. While silicide layers are formed above the source 511 and the drain 513, respectively, for metal contact, no silicide layer is formed above the floating gate 513 in order to enhance polarization by receiving light.

A control gate 523 is placed above an insulating layer positioned between a drain 521 and a source 522 of NMOS 520. The drain 521, which is a first N+ region, and the source 522, which is a second N+ region, are formed by injecting N+ impurities in the P-type substrate 550, and the control gate 523 is formed by doping polysilicon with N+ impurities. Silicide layers for metal contact are formed above the drain 521, the control gate 523 and the source 522, respectively. The drain 521 of NMOS 520 is connected with the drain 512 of PMOS 510. Moreover, a body 530 of NMOS 520 is connected to ground voltage GND. Here, the ground voltage GND may be a reference voltage for having NMOS 520 operate as a switch.

Compared to the unit pixel illustrated in FIG. 2, the unit pixel illustrated in FIG. 31 further includes a reset terminal 514 formed in the N-well 540. Although the unit pixel absorbs light in a short wavelength band through the floating gate, light in a long wavelength band may transmit through the floating gate. The transmitted light is absorbed inside the N-well and in a depletion layer at an interface between the N-well and the P-type substrate to generate electron-hole pairs. The generated holes move to the P-type substrate, but some of the electrons remain inside the N-well to increase the concentration of electrons in the N-well. The increased concentration of electrons in the N-well may cause an afterimage effect. In order to solve this problem, the N-well may be floated when the unit pixel is operating, and a specific voltage, for example, source voltage or current, may be supplied to the N-well through the reset terminal 514 to consistently remove the electrons remaining in the N-well when the unit pixel is not operating. Through this, an operation under a consistent condition is possible whenever the unit pixel is selected.

Meanwhile, the voltage or current supplied to the N-well through the reset terminal 514 when the unit pixel is not operating may vary. The temperature of the substrate may vary according to an outside temperature or an operation time. Since Vth of the N-well is a function inversely proportional to temperature, it is possible to adjust Vth of the N-well to be constant to the temperature by adjusting the voltage or current for resetting the N-well outside the unit pixel according to the temperature change. In other words, when the temperature increases, Vth becomes lower to allow more currents to flow, it is possible to reset with a higher voltage.

Figure 32:
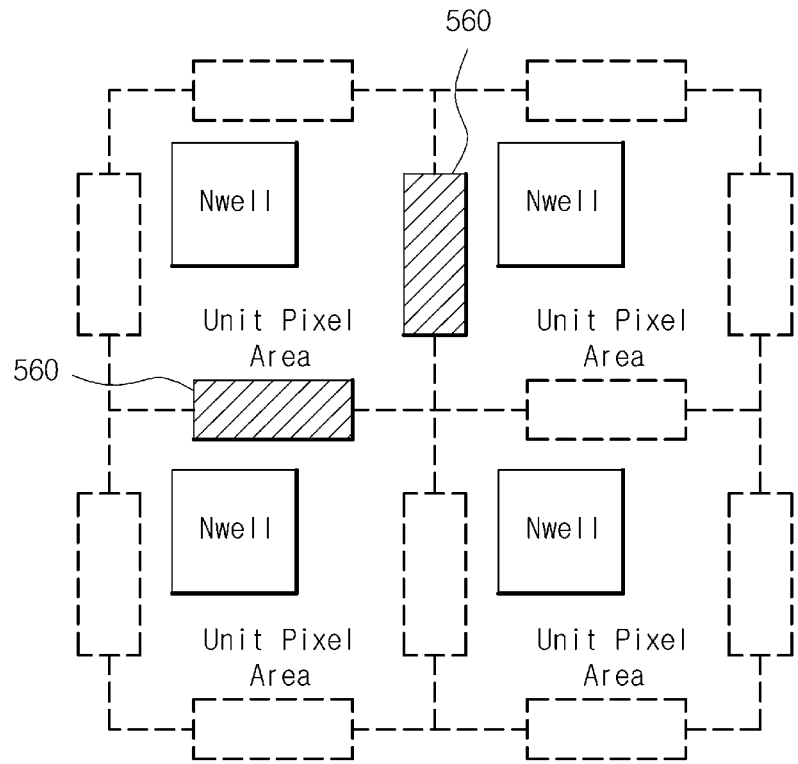
FIG. 32 illustrates an example of a structure for potentially separating an N-well of the unit pixel of the image sensor shown in FIG. 1 or FIG. 3.

FIG. 32 illustrates an example of a structure for potentially separating an N-well of the unit pixel of the image sensor shown in FIG. 1 or FIG. 3.

In a single N-well, one unit pixel or a plurality of unit pixels belonging to a 2×2 array, a row or a column may be formed. As illustrated in FIG. 32, in the case where one unit pixel is formed in a single N-well, P+ regions 560 connected to ground voltage GND may be formed around (i.e., on 4 surfaces of) the N-well to electrically separate the N-well from the P-type substrate in order to eliminate an overflow or interference between adjacent pixels. Meanwhile, in the case where the N-well is shared in order to reduce the size of the unit pixel, like the case where a plurality of unit pixels are formed in a single N-well, a channel formed close to a surface of the substrate including a buried channel through an isolation method such as LOCOS or STI may have little or no effect to an adjacent unit pixel.

Figure 33:
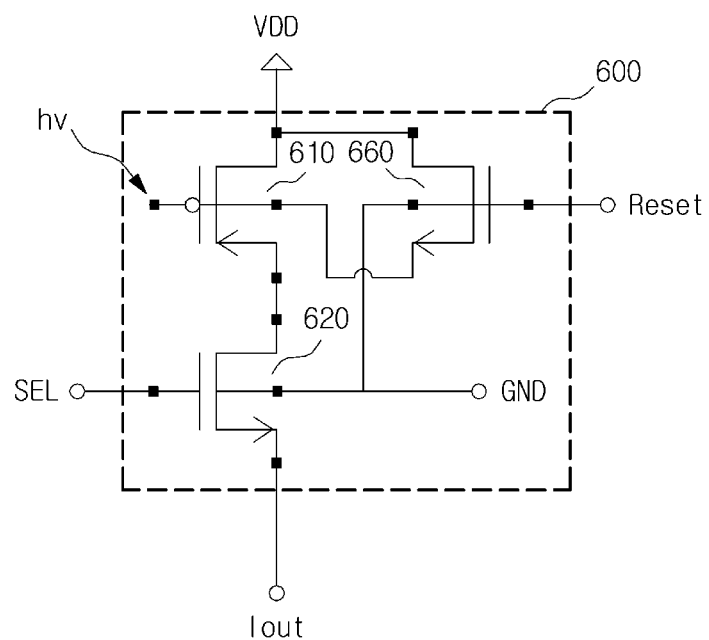
FIG. 33 illustrates yet another example of a circuit of a unit pixel of an image sensor.

FIG. 33 illustrates yet another example of a circuit of a unit pixel of an image sensor.

A unit pixel 600 performs photoelectric conversion of incident light to output a pixel current. For this, the unit pixel 600 is constituted with PMOS 610, which functions as a light-receiving part for photoelectric conversion of incident light, NMOS 620, which is connected to PMOS 610 to function as a switch, and NMOS 660, which resets an N-well in which the PMOS 610 is formed and transfers a bias voltage. Here, PMOS 610 controls the amount of the pixel current flowing through a channel formed between a source and a drain by an electric field that is generated by a floating gate that is polarized by the incident light, and NMOS 620 functions as a select transistor to perform the functions of selecting the unit pixel 600 to output the pixel current and determining an exposure time.

The source of PMOS 610 is coupled to source voltage VDD, and the drain thereof is coupled to the drain of NMOS 620. The N-well, which is the body of PMOS 610, has a contact formed thereon for connection with the reset and is coupled to the source of NMOS 660. The body of NMOS 620 and the body of NMOS 660 are a P-type substrate that may be connected to ground voltage GND. The source of NMOS 620 outputs the pixel current, which is then inputted to an IVC (I-V converter). The drain of NMOS 660 may be electrically connected to the source of PMOS 610, the source of NMOS 660 is connected to the N-well. PMOS 610, NMOS 620 and NMOS 660 may be each realized through a general MOSFET process.

Figure 34:
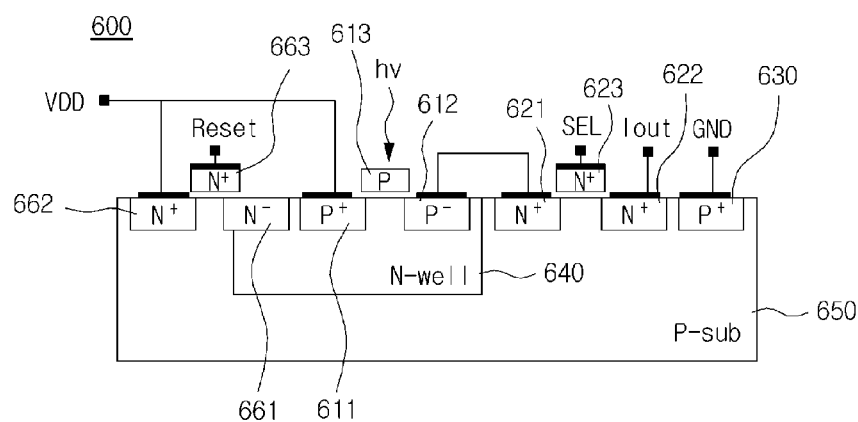
FIG. 34 illustrates a cross section of the circuit of the unit pixel of the image sensor shown in FIG. 33.

Compared to the unit pixel illustrated in FIG. 2, the unit pixel illustrated in FIG. 34 further includes NMOS 660 for reset formed in the N-well 640. The NMOS 660 for reset is structurally similar to a transfer gate of a 4 Transistor APS unit pixel for CIS but may functionally operate as a reset transistor to remove surplus electrons generated from EHPs. In order to maintain a constant concentration of electrons in the N-well 640, the N-well 640 may be floated when the unit pixel is operating, and a reset signal may be supplied to a reset gate 663 to consistently remove the electrons remaining in the N-well 640 when the unit pixel is not operating. Through this, an operation under a consistent condition is possible whenever the unit pixel is selected.

FIG. 34 illustrates a cross section of the circuit of the unit pixel of the image sensor shown in FIG. 33.

Referring to FIG. 34, the N-well 640 is formed in a P-type substrate 650, and the PMOS 610 constituting the unit pixel 600 is formed in the N-well 640. Moreover, the NMOS 620 is formed in the P-type substrate 650, and the NMOS 660 is formed between the N-well 640 and the P-type substrate 650.

A gate 613 is formed above an insulating layer placed between a source 611 and a drain 612 of PMOS 610, and the gate 613 is formed as a floating gate. By having the gate 613 floated, it is possible to facilitate recombination of EHPs in order to maintain a thermal equilibrium state when no light is incident. The source 611, which is a first P+ region, and the drain 612, which is a second P+ region, are formed by injecting P+ impurities in the N-well 640, and the floating gate 613 may have a concentration of impurities thereof adjusted by doping polysilicon with N− impurities. The floating gate 613 may become a P type, intrinsic or an N type, depending on the concentration of the N− impurities. While silicide layers are formed above the source 611 and the drain 613, respectively, for metal contact, no silicide layer is formed above the floating gate 613 in order to impede the reflection of light and facilitate the absorption and transmittance of light.

A control gate 623 is placed above an insulating layer positioned between a drain 621 and a source 622 of NMOS 620. The drain 521, which is a first N+ region, and the source 522, which is a second N+ region, are formed by injecting N+ impurities in the P-type substrate 650, and the control gate 623 is formed by doping polysilicon with N+ impurities. Silicide layers for metal contact are formed above the drain 521, the control gate 623 and the source 622, respectively. The drain 621 of NMOS 620 is connected with the drain 612 of PMOS 610. Moreover, a body 630 of NMOS 620 is connected to ground voltage GND. Here, the ground voltage GND may be a reference voltage for having NMOS 620 operate as a switch.

A source 661 of NMOS 660 is formed in the N-well 640 and the P-type substrate, and the drain 662 thereof is formed in the P-type substrate 650. The source 661 and the drain 662 are formed as N+ diffusion layers, and a reset gate 663 is formed with polysilicon. Generally, NMOS cannot transfer a high voltage sufficiently, and thus electrons may not escape to the drain 662 when reset. To solve this, by forming the source 661 to extend to the N-well 640 and the P-type substrate, the electrons may escape through the drain 662 connected to the source voltage VDD when reset, effectively removing the electrons remaining in the N-well 640. Silicide layers for metal contact are formed above the drain 662 and the reset gate 663, respectively.

Owing to NMOS 660, the N-well 640 and other unit pixels may be independently maintained as floating bodies, and the entire unit pixels may be set with a same condition when reset is on. Meanwhile, when reset is off, that is, when the unit pixel is operating, a reverse bias condition may be provided to the source voltage VDD from a periphery of the N-well 640, and a depletion layer may be diffused around a lower portion, thereby possibly solving an interference problem between N-wells. That is, since the P-type substrate, which is the body 630, is connected to the ground voltage GND but the drain 662 for reset is connected to the source voltage VDD, there is a reverse bias between the drain 662 and the P-type substrate 650, and the depletion layer may be enlarged around the lower portion of the drain 662.

Meanwhile, by applying a high voltage through the control gate 623 of NMOS 620, an electric charge remaining at a connection between PMOS 610 and NMOS 620 may be removed. When the unit pixel 600 operates, Vds of the unit pixel is completed by a bottom voltage connected to an IVC (not shown) through NMOS 620, and the pixel current is transferred to the IVC through the switching of NMOS 620. Meanwhile, Vt of NMOS 620 may be low in order to have the property of the unit pixel 600 affected less by the MOSFET property of NMOS 620. For example, 4 NMOS transistors used for a unit pixel in CIS have a native or medium Vt, which is lower than that of a general NMOS. Accordingly, an SEL control signal applied to the control gate 623 of NMOS 620 may be applied by, for example, a charge pump with a voltage that is higher by 10 to 25% than the generally applied 3.3 V, and the problem of remaining charges that have not been completely transferred at the connection between PMOS 610 and NMOS 620 can be solved. Here, the SEL control signal may be 4 to 4.5 V.

Meanwhile, in order to prevent the pixel current generated by the unit pixel 600 from moving over to another unit pixel, it is possible to install an electrical potential barrier at a lower portion of the channel of NMOS 620. The electrical potential barrier may be formed by adding a HAL implant to the lower portion of the channel.

Figure 35:
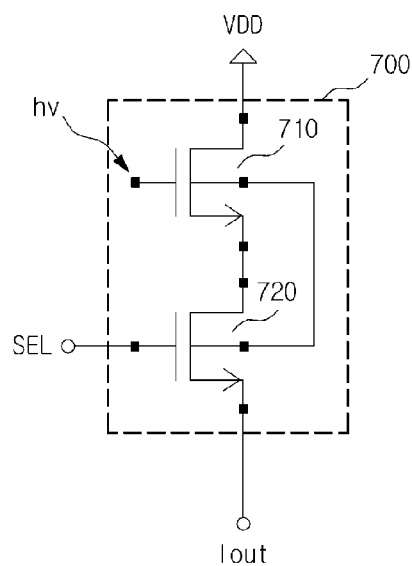
FIG. 35 illustrates still another example of a circuit of a unit pixel of an image sensor.
Figure 36:
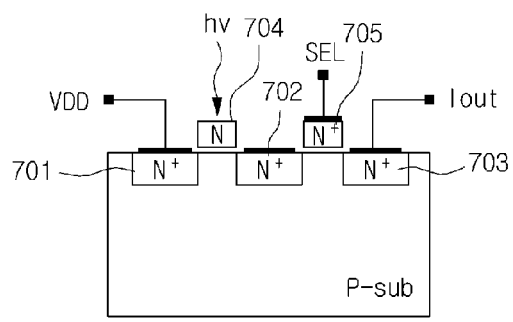
FIG. 36 illustrates a cross section of the circuit of the unit pixel of the image sensor shown in FIG. 35.

FIG. 35 illustrates still another example of a circuit of a unit pixel of an image sensor, and FIG. 36 illustrates a cross section of the circuit of the unit pixel of the image sensor shown in FIG. 35.

A unit pixel 700 performs photoelectric conversion of incident light to output a pixel current. For this, the unit pixel 700 is constituted with NMOS 710, which functions as a light-receiving part for photoelectric conversion of incident light, and NMOS 720, which is connected to NMOS 710 to function as a switch. Here, NMOS 710 controls the amount of the pixel current flowing through a channel formed between a source and a drain by an electric field that is generated by a floating gate that is polarized by the incident light, and NMOS 720 functions as a select transistor to perform the functions of selecting the unit pixel 700 to output the pixel current and determining an exposure time. An SEL control signal applied to the gate of NMOS 720 may be a voltage signal that is greater than source voltage VDD.

Bodies of NMOS 710 and NMOS 720 share a P-type substrate, may be each a P-well having a different coping concentration, and may be formed as a floating body. The unit pixel 700 is constituted with three N+ regions 701, 702, 703, which are formed with predetermined distances on the P-type substrate, a floating gate 704, which is formed above an insulating layer placed among the regions, and a control gate 705, to which the SEL control signal is inputted. A first N+ region 701 operates as a drain of NMOS 710 and has source voltage VDD applied thereto. A second N+ region 702 operates as a source of NMOS 710 and a drain of NMOS 720. The floating gate 704 is formed above the insulating layer placed between the first N+ region 701 and the second N+ region 702. A third N+ region 703 operates as a source of NMOS 720 and is connected to an IVC to output the pixel current. The control gate 705 is formed above the insulating layer placed between the second N+ region 702 and the third N+ region 703. While silicide layers are formed above the first to third N+ regions 701, 702, 703 and the control gate 705, respectively, for metal contact, no silicide layer is formed above the floating gate 704 in order to impede the reflection of light and facilitate the absorption and transmittance of light. With this structure, it is possible to combine two N+ regions required for two NMOS to one N+ region when the NMOS is laid out. In other words, the second N+ region 702 may operate as the source of NMOS 710 and the drain of NMOS 720, thereby reducing the size of the unit pixel. Meanwhile, the IVC may convert the pixel current outputted by driving a capacitor or a resistor to a voltage.

Figure 37:
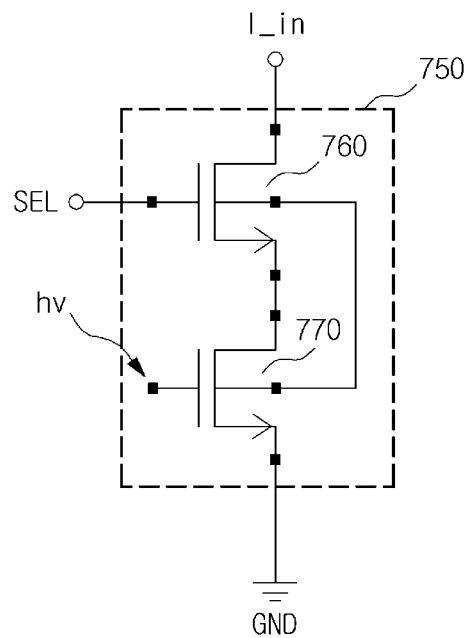
FIG. 37 illustrates still yet another example of a circuit of a unit pixel of an image sensor.
Figure 38:
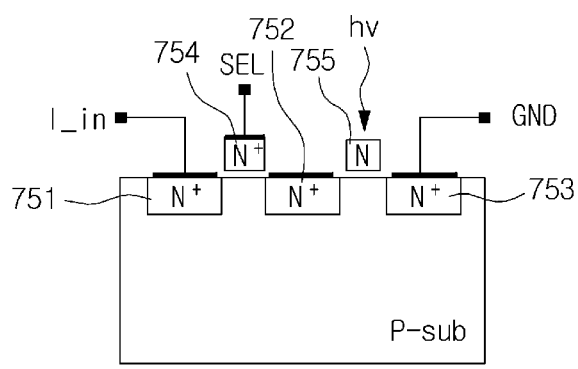
FIG. 38 illustrates a cross section of the circuit of the unit pixel of the image sensor shown in FIG. 37.

FIG. 37 illustrates still yet another example of a circuit of a unit pixel of an image sensor, and FIG. 38 illustrates a cross section of the circuit of the unit pixel of the image sensor shown in FIG. 37.

A unit pixel 750 performs photoelectric conversion of incident light to output a pixel current. For this, the unit pixel 750 is constituted with NMOS 770, which functions as a light-receiving part for photoelectric conversion of incident light, and NMOS 760, which is connected to NMOS 770 to function as a switch. Here, NMOS 770 controls the amount of the pixel current flowing through a channel formed between a source and a drain by an electric field that is generated by a floating gate that is polarized by the incident light, and NMOS 760 functions as a select transistor to perform the functions of selecting the unit pixel 750 to have driving current I_in inputted thereto and determining an exposure time. An SEL control signal applied to the gate of NMOS 760 may be a voltage signal that is greater than source voltage VDD.

Bodies of NMOS 760 and NMOS 770 share a P-type substrate and may be formed as a floating body. The unit pixel 750 is constituted with three N+ regions 751, 752, 753, which are formed with predetermined distances on the P-type substrate, and a control gate 754 and a floating gate 755, which are formed above an insulating layer placed among the N+ regions 751, 752, 753. A first N+ region 751 operates as a drain of NMOS 760 and has the driving current I_in applied thereto. A second N+ region 752 operates as a source of NMOS 760 and a drain of NMOS 770. The control gate 754 is formed above the insulating layer placed between the first N+ region 751 and the second N+ region 752. A third N+ region 753 operates as a source of NMOS 770 and is connected to ground voltage GND to consume the driving current I_in. The floating gate 755 is formed above the insulating layer placed between the second N+ region 752 and the third N+ region 753. While silicide layers are formed above the first to third N+ regions 751, 752, 753 and the control gate 754, respectively, for metal contact, no silicide layer is formed above the floating gate 755 in order to impede the reflection of light and facilitate the absorption and transmittance of light. With this structure, it is possible to combine two N+ regions required for two NMOS to one N+ region when the NMOS is laid out. Here, an IVC may convert a change in an amount of electric charge, by which a voltage charged with reset is reduced by the light-receiving part 770, to a signal, through a method of having the driving current I_in consumed to the ground voltage GND by charging the electric charge in a capacitor and providing the driving current I_in to the light-receiving part 770 through the SEL control gate 754. Meanwhile, the IVC may use a current mirror in circuit or have the current mirror further included in the above structure, and may convert the mirrored current to a voltage signal.

Figure 39:
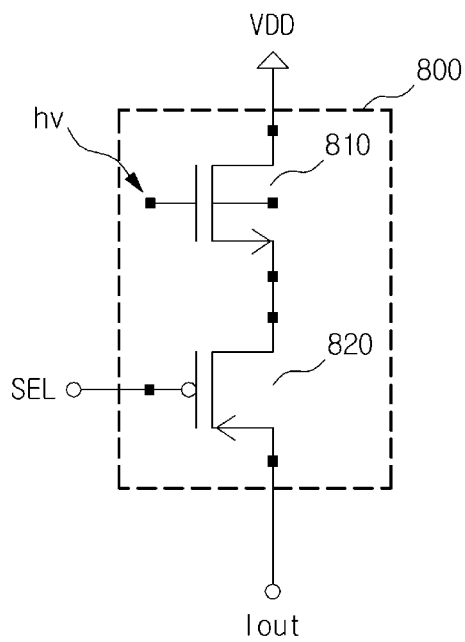
FIG. 39 illustrates still yet another example of a circuit of a unit pixel of an image sensor.
Figure 40:
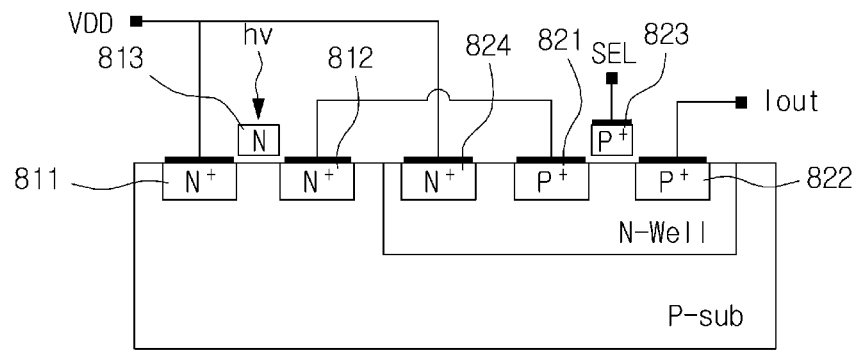
FIG. 40 illustrates a cross section of the circuit of the unit pixel of the image sensor shown in FIG. 39.

FIG. 39 illustrates still yet another example of a circuit of a unit pixel of an image sensor, and FIG. 40 illustrates a cross section of the circuit of the unit pixel of the image sensor shown in FIG. 39.

A unit pixel 800 performs photoelectric conversion of incident light to output a pixel current. For this, the unit pixel 800 is constituted with NMOS 810, which functions as a light-receiving part for photoelectric conversion of incident light, and PMOS 820, which is connected to NMOS 810 to function as a switch. Here, NMOS 810 controls the amount of the pixel current flowing through a channel formed between a source and a drain by an electric field that is generated by a floating gate that is polarized by the incident light, and PMOS 820 functions as a select transistor to perform the functions of selecting the unit pixel 800 to output the pixel current and determining an exposure time. An SEL control signal applied to the gate of PMOS 820 may be turned on to ground voltage GND, and a voltage greater than source voltage VDD may be applied to a body of PMOS 820.

NMOS 810 is formed in a P-type substrate, and a body thereof is floated. PMOS 820 is formed in an N-well formed in the P-type substrate, and a body thereof is connected to VDD. NMOS 810 is constituted with a first N+ region 811 and a second N+ region 812, which are formed in the P-type substrate, and a floating gate 813 formed above an insulating layer placed between the first N+ region 811 and the second N+ region 812. PMOS 820 is constituted with a first P+ region 821, a second P+ region 822, a control gate 823 formed above an insulating layer placed between the first P+ region 821 and the second P+ region 822, and a third N+ region 824, and the first P+ region 821, the second P+ region 822 and the third N+ region 824 are formed in the N-well. The first N+ region 811 operates as a drain of NMOS 810 and has source voltage VDD applied thereto. The second N+ region 812 operates as a source of NMOS 810. The floating gate 813 is formed between the first N+ region 811 and the second N+ region 812. The first P+ region 821 operates as a source and is connected with a source of NMOS 810. The second P+ region 822 operates as a drain of PMOS 820 and is connected to an IVC to output the pixel current. The control gate 823 is formed between the first P+ region 821 and the second P+ region 822. The third N+ region 824 is connected to source voltage VDD. Here the source voltage VDD may be a reference voltage for allowing PMOS 820 to operate as a switch. While silicide layers are formed above the first to third N+ regions 811, 812, 824, the first and second P+ regions 821, 822 and the control gate 823, respectively, for metal contact, no silicide layer is formed above the floating gate 813 in order to impede the reflection of light and facilitate the absorption and transmittance of light. Although the unit pixel illustrated in FIGS. 39 and 12b has a single select transistor PMOS for unit pixel constituted in a single, independent N-well, a single N-well may be constituted with a select transistor PMOS of a plurality of unit pixels belonging to a 2×2 array, a row or a column. In such a case, it is possible to reduce the overall size of the unit pixel by realizing a plurality of PMOS functioning as a switch in a single N-well. Meanwhile, the IVC may convert the pixel current outputted by driving a capacitor or a resistor to a voltage.

Figure 41:
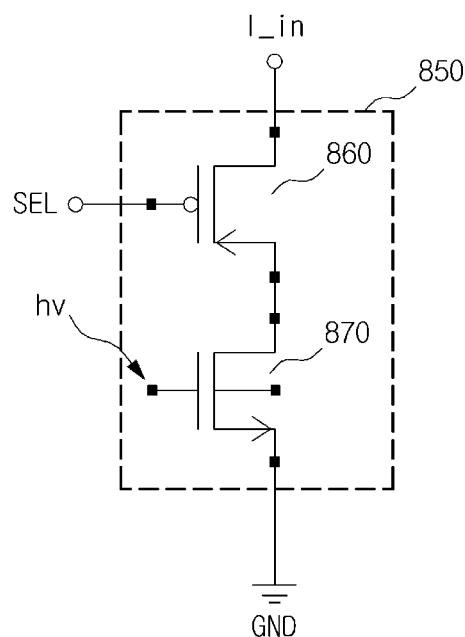
FIG. 41 illustrates still yet another example of a circuit of a unit pixel of an image sensor.
Figure 42:
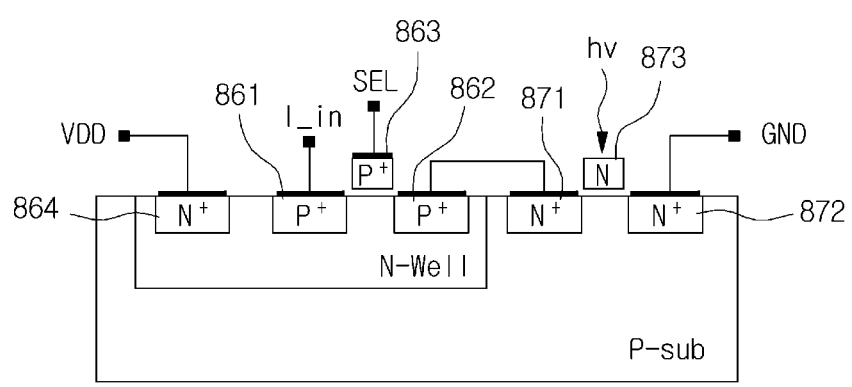
FIG. 42 illustrates a cross section of the circuit of the unit pixel of the image sensor shown in FIG. 41.

FIG. 41 illustrates still yet another example of a circuit of a unit pixel of an image sensor, and FIG. 42 illustrates a cross section of the circuit of the unit pixel of the image sensor shown in FIG. 41.

A unit pixel 850 performs photoelectric conversion of incident light to output a pixel current. For this, the unit pixel 850 is constituted with NMOS 870, which functions as a light-receiving part for photoelectric conversion of incident light, and PMOS 860, which is connected to NMOS 870 to function as a switch. Here, NMOS 870 controls the amount of the pixel current flowing through a channel formed between a source and a drain by an electric field that is generated by a floating gate that is polarized by the incident light, and PMOS 860 functions as a select transistor to perform the functions of selecting the unit pixel 850 to have driving current I_in inputted thereto and determining an exposure time. An SEL control signal applied to the gate of PMOS 860 may be turned on to ground voltage GND, and a voltage greater than source voltage VDD may be applied to a body of PMOS 860.

PMOS 860 is formed in a P-type substrate, and a body thereof is connected to VDD. NMOS 870 is formed in the P-type substrate, and a body thereof is floated. PMOS 860 is constituted with a first P+ region 861, a second P+ region 862, a control gate 863 formed above an insulating layer placed between the first P+ region 861 and the second P+ region 862, and a third N+ region, and the first P+ region 861, the second P+ region 862 and the third N+ region 864 are all formed in an N-well. NMOS 870 is constituted with a first N+ region 871 and a second N+ region 872, which are formed in the P-type substrate, and a floating gate 873 formed above an insulating layer placed between the first N+ region 871 and the second N+ region 872. The first P+ region 861 operates as a source and has driving current I_in applied thereto. The control gate 863 is formed between the first P+ region 861 and the second P+ region 862. The third N+ region 864 is connected to source voltage VDD. Here the source voltage VDD may be a reference voltage for allowing PMOS 860 to operate as a switch. The first N+ region 871 operates as a drain of NMOS 870 and is connected with a drain of PMOS 860. The second N+ region 872 operates as a source of NMOS 870 and is connected to ground voltage GND to consume the driving current I_in. A first floating gate 873 is formed between the first N+ region 871 and the second N+ region 872. While silicide layers are formed above the first and second P+ regions 861, 862, the first to third N+ regions 871, 872, 864 and the control gate 863, respectively, for metal contact, no silicide layer is formed above the first floating gate 873 in order to impede the reflection of light and facilitate the absorption and transmittance of light. Although the unit pixel illustrated in FIGS. 41 and 13b has a single select transistor PMOS for unit pixel formed in a single, independent N-well, a plurality of select transistors PMOS of a plurality of unit pixels belonging to a 2×2array, a row or a column may be also formed in a single N-well. In such a case, it is possible to reduce the overall size of the unit pixel by realizing a plurality of PMOS functioning as a switch in a single N-well. Here, an IVC may convert a change in an amount of electric charge, by which a voltage charged with reset is reduced by the light-receiving part 870, to a signal, through a method of having the driving current I_in consumed to the ground voltage GND by providing the electric charge charged in a capacitor to the driving current I_in. Meanwhile, the IVC may use a current mirror in circuit or have the current mirror further included in the above structure, and may convert the mirrored current to a voltage signal.

Figure 43:
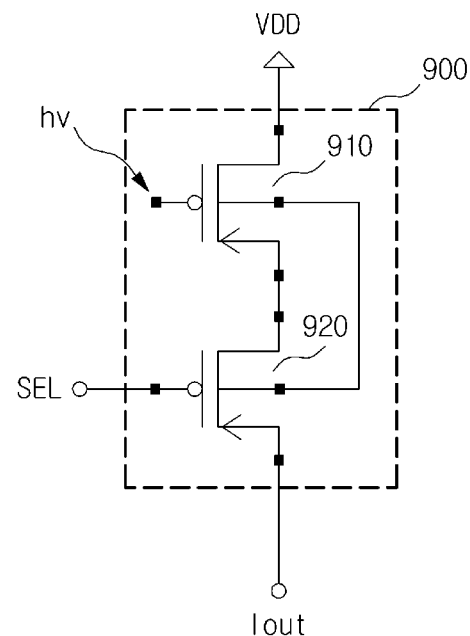
FIG. 43 illustrates still yet another example of a circuit of a unit pixel of an image sensor.
Figure 44:
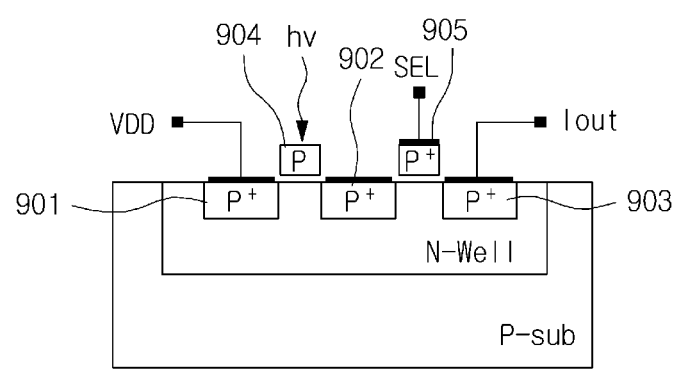
FIG. 44 illustrates a cross section of the circuit of the unit pixel of the image sensor shown in FIG. 43.

FIG. 43 illustrates still yet another example of a circuit of a unit pixel of an image sensor, and FIG. 44 illustrates a cross section of the circuit of the unit pixel of the image sensor shown in FIG. 43.

A unit pixel 900 performs photoelectric conversion of incident light to output a pixel current. For this, the unit pixel 900 is constituted with PMOS 910, which functions as a light-receiving part for photoelectric conversion of incident light, and PMOS 920, which is connected to PMOS 910 to function as a switch. Here, PMOS 910 controls the amount of the pixel current flowing through a channel formed between a source and a drain by an electric field that is generated by a floating gate that is polarized by the incident light, and PMOS 920 functions as a select transistor to perform the functions of selecting the unit pixel 900 to have driving current to output the pixel current and determining an exposure time. Since source voltage VDD, which becomes a reference voltage when PMOS 920 operates as a switch, is not connected to a body of PMOS 920, it is possible for an SEL control signal, which is applied to a control gate of PMOS 920, to turn on PMOS 920 with a lower (−) voltage than ground voltage GND. Meanwhile, since the body of the PMOS 920 is floated with PMOS 910, which is the light-receiving part, it is possible to turn on PMOS 920 with ground voltage GND if a high voltage is applied to source voltage VDD that is applied to PMOS 910.

Bodies of PMOS 910 and PMOS 920 share an N-well formed in a P-type substrate and may be formed as a floating body. The unit pixel 900 is constituted with three P+ regions 901, 902, 903, which are formed with predetermined distances in the N-well, and a single floating gate 904 and a single control gate 905, which are formed in between the three P+ regions 901, 902, 903. A first P+ region 901 operates as a source of PMOS 910 and has source voltage VDD supplied thereto. A second P+ region 902 operates as a drain of PMOS 910 and a source of PMOS 920. With this structure, it is possible to combine two P+ regions required for two PMOS to one P+ region when the PMOS is laid out, thereby reducing the size of the unit pixel. The floating gate 904 is formed above an insulating layer placed between the first P+ region 901 and the second P+ region 902. A third P+ region 903 operates as a drain of PMOS 920 and is connected to an IVC to output pixel current. The control gate 905 is formed above an insulating layer formed between the second P+ region 902 and the third P+ region 903. While silicide layers are formed above the first to third P+ regions 901, 902, 903 and the control gate 905, respectively, for metal contact, no silicide layer is formed above the floating gate 904 in order to impede the reflection of light and facilitate the absorption and transmittance of light. Meanwhile, the IVC may convert the pixel current outputted by driving a capacitor or a resistor to a voltage.

Figure 45:
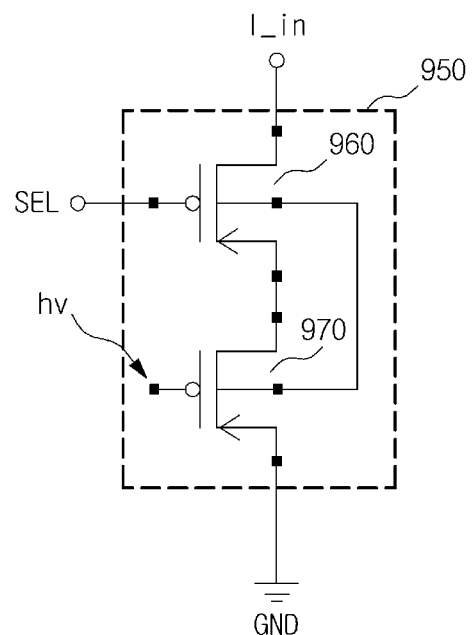
FIG. 45 illustrates still yet another example of a circuit of a unit pixel of an image sensor.
Figure 46:
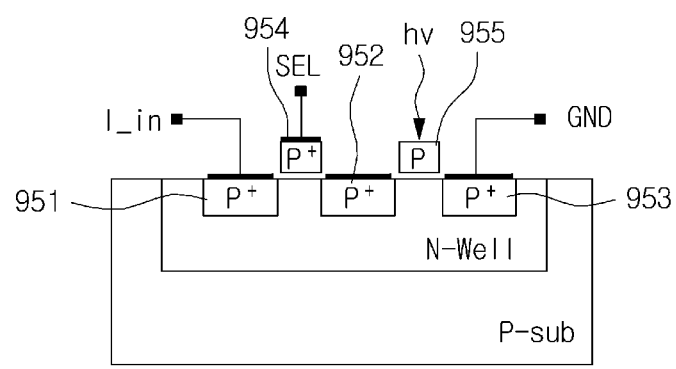
FIG. 46 illustrates a cross section of the circuit of the unit pixel of the image sensor shown in FIG. 45.

FIG. 45 illustrates still yet another example of a circuit of a unit pixel of an image sensor, and FIG. 46 illustrates a cross section of the circuit of the unit pixel of the image sensor shown in FIG. 45.

A unit pixel 950 performs photoelectric conversion of incident light to output a pixel current. For this, the unit pixel 950 is constituted with PMOS 970, which functions as a light-receiving part for photoelectric conversion of incident light, and PMOS 960, which is connected to PMOS 970 to function as a switch. Here, PMOS 970 controls the amount of the pixel current flowing through a channel formed between a source and a drain by an electric field that is generated by a floating gate that is polarized by the incident light, and PMOS 960 functions as a select transistor to perform the functions of selecting the unit pixel 960 to have driving current I_in inputted thereto and determining an exposure time. Since source voltage VDD, which becomes a reference voltage when PMOS 960 operates as a switch, is not connected to a body of PMOS 960, it is possible for an SEL control signal, which is applied to a control gate of PMOS 960, to turn on PMOS 960 with a lower (−) voltage than ground voltage GND. Meanwhile, since the body of the PMOS 960 is floated with PMOS 970, which is the light-receiving part, it is possible to turn on PMOS 960 with ground voltage GND if a high voltage is applied to source voltage VDD that supplies I_in from an outside of the unit pixel 950.

Bodies of PMOS 960 and PMOS 970 share an N-well formed in a P-type substrate and are formed as a floating body. The unit pixel 950 is constituted with three P+ regions 951, 952, 953, which are formed with predetermined distances in the N-well, and a single control gate 954 and a single floating gate 955, which are formed in between the three P+ regions 951, 952, 953. A first P+ region 951 operates as a source of PMOS 960 and has driving current I-in supplied thereto. A second P+ region 952 operates as a drain of PMOS 960 and a source of PMOS 970. With this structure, it is possible to combine two P+ regions required for two PMOS to one P+ region when the PMOS is laid out, thereby reducing the size of the unit pixel. The control gate 954 is formed above an insulating layer placed between the first P+ region 951 and the second P+ region 952. A third P+ region 953 operates as a drain of PMOS 970 and is connected to ground voltage GND to consume the supplied driving current I_in. The floating gate 955 is formed above an insulating layer formed between the second P+ region 952 and the third P+ region 953. While silicide layers are formed above the first to third P+ regions 951, 952, 953 and the control gate 954, respectively, for metal contact, no silicide layer is formed above the floating gate 955 in order to impede the reflection of light and facilitate the absorption and transmittance of light. Here, an IVC may convert a change in an amount of electric charge, by which a voltage charged with reset is reduced by the light-receiving part 770, to a signal, through a method of having the driving current I_in consumed to the ground voltage GND by providing the electric charge charged in a capacitor to the driving current I_in. Meanwhile, the IVC may use a current mirror in circuit or have the current mirror further included in the above structure, and may convert the mirrored current to a voltage signal.

Figure 47:
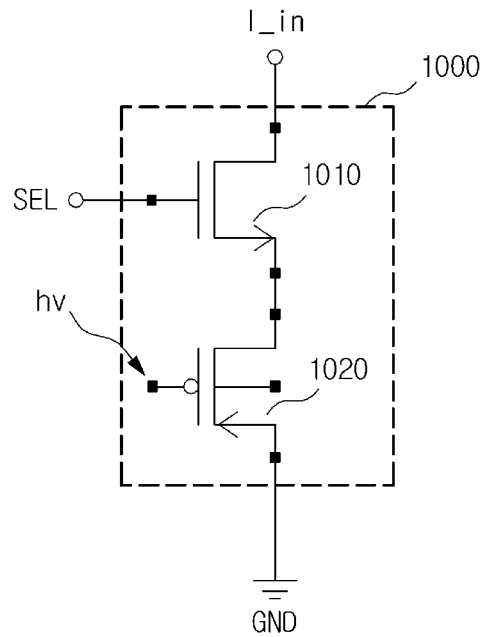
FIG. 47 illustrates still yet another example of a circuit of a unit pixel of an image sensor.
Figure 48:
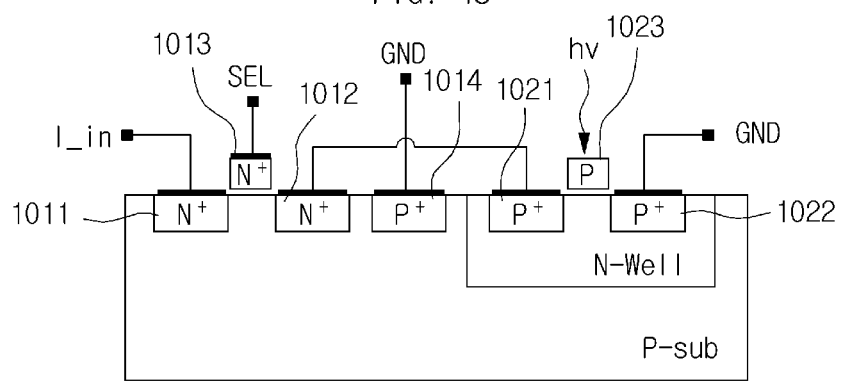
FIG. 48 illustrates a cross section of the circuit of the unit pixel of the image sensor shown in FIG. 47.

FIG. 47 illustrates still yet another example of a circuit of a unit pixel of an image sensor, and FIG. 48 illustrates a cross section of the circuit of the unit pixel of the image sensor shown in FIG. 47.

A unit pixel 1000 performs photoelectric conversion of incident light to output a pixel current. For this, the unit pixel 1000 is constituted with PMOS 1020, which functions as a light-receiving part for photoelectric conversion of incident light, and NMOS 1010, which is connected to PMOS 1020 to function as a switch. Here, PMOS 1020 controls the amount of the pixel current flowing through a channel formed between a source and a drain by an electric field that is generated by a floating gate that is polarized by the incident light, and NMOS 1010 functions as a select transistor to perform the functions of selecting the unit pixel 1000 to have driving current I_in inputted thereto and determining an exposure time. An SEL control signal applied to the gate of NMOS 1010 may be a voltage signal that is greater than source voltage VDD.

NMOS 1010 is formed in a P-type substrate, and a body thereof is connected to ground voltage GND. PMOS 1020 is formed in an N-well formed in the P-type substrate, and a body thereof is floated. NMOS 1010 is constituted with a first N+ region 1011 and a second N+ region 1012, which are formed in the P-type substrate, a control gate 1013, which is formed above an insulating layer placed between the first N+ region 1011 and the second N+ region 1012, and a third P+ region 1014. PMOS 1012 is constituted with a first P+ region 1021, a second P+ region 1022 and a floating gate 1023 formed above an insulating layer placed between the first P+ region 1021 and the second P+ region 1022, which are formed in the N-well. The first N+ region 1011 operates as a drain and has the driving current I_in applied thereto. The second N+ region 1012 operates as a source of NMOS 1010. The control gate 1013 is formed above the insulating layer placed between the first N+ region 1011 and the second N+ region 1012. The third P+ region 1014 is connected to ground voltage GND. Here, the ground voltage GND may be a reference voltage for allowing NMOS 1010 to operate as a switch. The first P+ region 1021 operates as a source of PMOS 1020 and is connected with the source of NMOS 1010. The second P+ region 1022 operates as a drain of PMOS 1020 and is connected to ground voltage GND to consume the applied driving current I_in. The floating gate 1023 is formed above the insulating layer placed between the first P+ region 1021 and the second P+ region 1022. While silicide layers are formed above the first and second N+ regions 1011, 1012, the first to third P+ regions 1021, 1022, 1014 and the control gate 1013, respectively, for metal contact, no silicide layer is formed above the floating gate 1023 in order to impede the reflection of light and facilitate the absorption and transmittance of light. Here, an IVC may convert a change in an amount of electric charge, by which a voltage charged with reset is reduced by the light-receiving part 770, to a signal, through a method of having the driving current I_in consumed to the ground voltage GND by providing the electric charge charged in a capacitor to the driving current I_in. Meanwhile, the IVC may use a current mirror in circuit or have the current mirror further included in the above structure, and may convert the mirrored current to a voltage signal.

Figure 49:
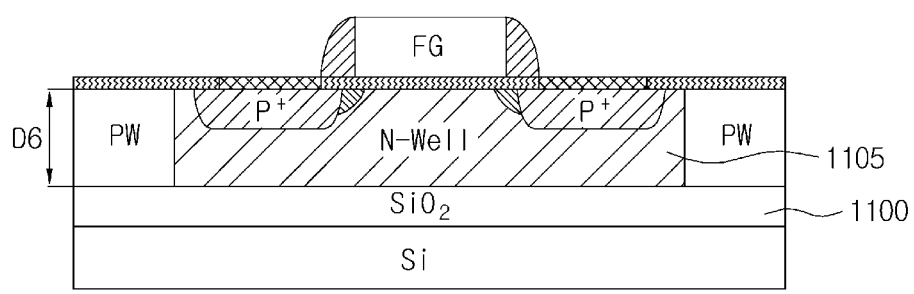
FIG. 49 illustrates an example of a circuit of a unit pixel of an image sensor embodied in an SOI wafer.

FIG. 49 illustrates an example of a circuit of a unit pixel of an image sensor embodied in an SOI wafer.

The incident light may be transmitted without being completely absorbed by a floating gate of a unit pixel. Particularly, the visible light in a long wavelength band transmits through the floating gate and then is absorbed by a depletion region formed at an interface between an N-well and a P-type substrate to generate electron-hole pairs. The generated holes move to the P-type substrate, but a certain amount of electrons may remain in the N-well. Although most of the electrons move to a source to which source voltage is supplied, a certain amount of electrons cannot move to the source due to a potential barrier caused by the interface functioning as a PN junction. When a concentration of electrons in the N-well is increased by the remaining electrons, a negative effect such as an afterimage effect may be occurred. In a method for preventing the electrons from remaining, source voltage or current may be supplied to the N-well to consistently remove the electrons remaining inside the N-well. In the meantime, an SOI substrate may be used in order not to form an interface, which is the cause of the remaining electrons. An N-well 1105 is formed above an SiO$_2$ layer 1100. Here, since the N-well 1105 may be formed in such a way that a bottom portion thereof is in contact with the SiO$_2$ layer 1100, a heterojunction (NP) interface is not created. In addition, the SOI substrate is independent from a temperature change and is effective in noise reduction.

In an embodiment, a silicon layer above SiO$_2$ 1105 may be thinly formed in a thickness D6 of 100 to 200 nm. In the case of manufacturing a sensor exclusively for visible light, a distortion may be occurred in an image detected by a near infrared ray having a wavelength of 700 nm or greater. That is, in order to keep the near infrared ray having passed through the floating gate from being absorbed by the floating gate and the N-well, a wafer having the small thickness D6 of the silicon layer above SiO$_2$ 1105 is used. By using the wafer having the small thickness D6 of the silicon layer, it is possible to reduce the generation of the electron-hole pairs caused by the near infrared ray in the floating gate and the N-well. Through this, it is possible to prevent a color distortion caused by the near infrared ray, and it is advantageously not necessary to use an infrared filter that is often attached to a bottom of an external optical lens.

The above description is provided for illustrative purposes, and it shall be appreciated by anyone having ordinary skill in the art to which the present invention pertains that permutations to other specific forms are possible without modifying the technical ideas or essential features. Therefore, the embodiments described above shall be understood to be illustrative, not restrictive, in every aspect.

The scope of the present invention shall be apparent through the claims appended below, rather than through the above description, and it shall be interpreted that every permutation or modified form contrived from the meaning and scope, and their equivalents, of the claims is included in the claims of the present invention.

The invention claimed is:

1. A unit pixel formed on a substrate and configured to convert incident light to an electrical signal, comprising:
   a source having a source voltage supplied thereto and having a silicide layer for metal contact formed thereabove;
   a drain spaced apart from the source and having a silicide layer for metal contact formed thereabove;
   a channel formed between the source and the drain and having a current flowed therethrough;
   an insulating layer formed above the channel; and
   a floating gate having a nonsal structure in which no silicide layer is formed thereabove in order to facilitate an absorption of light, formed above the insulating layer so as to be placed between the source and the drain, and configured to control an amount of current flowing through the channel by an electric field generated by electron-hole pairs generated by the incident light,
   wherein a body of the unit pixel is floated, and wherein the electric field is configured to act on the channel by electrons aggregated toward the source and holes aggregated toward the drain by the source voltage supplied to the source.

2. The unit pixel of claim 1, wherein the insulating layer is formed to be extended at a lower portion of the floating gate.

3. The unit pixel of claim 1, wherein a thickness of the insulating layer is about 7 to 10 nm.

4. The unit pixel of claim 1, wherein the insulating layer is made of a high-K insulating material.

5. The unit pixel of claim 1, wherein the floating gate is doped to be intrinsic.

6. The unit pixel of claim 1, wherein a thickness of the floating gate is between about 100 nm and 1 um.

7. The unit pixel of claim 1, wherein a lower edge of the floating gate is formed as a plane to allow the electrons to be dispersed.

8. The unit pixel of claim 1, wherein the insulating layer is placed between the source and the drain, and lateral surfaces thereof are each formed at an inclined trench.

9. The unit pixel of claim 1, wherein the source comprises:
an LDD (lightly doped drain) region formed at a lower portion of one side of the floating gate;
a P+ region formed at one side of the LDD region; and
a silicide layer formed on at least a portion above the P+ region for metal contact.

10. The unit pixel of claim 9, wherein the LDD region is formed at a predetermined depth in the lower portion of one side of the floating gate and spaced apart from the insulating layer.

11. The unit pixel of claim 9, wherein the LDD region is formed with a low doping concentration in order to lower an electric field with the floating gate.

12. The unit pixel of claim 1, wherein the substrate is an epitaxial wafer.

13. The unit pixel of claim 1, wherein the substrate is an SOI wafer.

14. A unit pixel formed on a substrate and configured to convert incident light to an electrical signal, comprising:
a light-receiving part configured to output a pixel current by the incident light; and
a select transistor configured to control an output of the pixel current,
wherein the light-receiving part comprises:
a source having a silicide layer for metal contact formed thereabove;
a drain spaced apart from the source and having a silicide layer for metal contact formed thereabove;
a channel formed between the source and the drain and having a current flowed therethrough;
an insulating layer formed above the channel; and
a floating gate having a nonsal structure in which no silicide layer is formed thereabove in order to facilitate an absorption of light, formed above the insulating layer so as to be placed between the source and the drain, and configured to control an amount of current flowing through the channel by an electric field generated by electron-hole pairs generated by the incident light,
wherein a body of the unit pixel is floated, and
wherein the electric field is generated by electrons aggregated toward the source and holes aggregated toward the drain by the source voltage supplied to the source.

15. The unit pixel of claim 14, wherein the light-receiving part is formed in an N-well formed in the substrate.

16. The unit pixel of claim 15, wherein the light-receiving part further comprises a reset terminal formed in the N-well and having a reset signal inputted thereto.

17. The unit pixel of claim 15, further comprising:
a drain formed in the N-well;
a source formed in the substrate and having source voltage inputted thereto; and
a reset gate placed between the drain and the source and having a reset signal inputted thereto.

18. The unit pixel of claim 14, wherein a body of the select transistor is connected to a ground.

19. The unit pixel of claim 14, wherein the light-receiving part and the select transistor share a body.

20. The unit pixel of claim 14, further comprising a charge pump for supplying a high voltage to a gate of the select transistor.

21. The unit pixel of claim 14, further comprising a polarization inducing structure spaced apart from an upper portion of the floating gate.

* * * * *